(12) United States Patent
Kikuchi et al.

(10) Patent No.: US 6,317,864 B1
(45) Date of Patent: Nov. 13, 2001

(54) SYSTEM AND METHOD FOR GRAPHIC LAYOUT MODIFICATION

(75) Inventors: Hideo Kikuchi; Arata Yato, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/274,474

(22) Filed: Mar. 23, 1999

(30) Foreign Application Priority Data

Mar. 24, 1998 (JP) .................................................. 10-075915

(51) Int. Cl.[7] ....................................................... G06F 17/50
(52) U.S. Cl. ..................................................... 716/11; 716/1
(58) Field of Search ........................ 716/11, 1; 395/130, 395/161; 364/523, 900

(56) References Cited

U.S. PATENT DOCUMENTS

| | | | |
|---|---|---|---|
| 4,070,710 | * | 1/1978 | Sukonick et al. ..................... 364/900 |
| 5,051,930 | * | 9/1991 | Kuwabara et al. ................... 364/523 |
| 5,353,401 | * | 10/1994 | Iizawa et al. ......................... 395/161 |
| 5,495,567 | * | 2/1996 | Iizawa et al. ......................... 395/161 |
| 5,649,081 | * | 7/1997 | Nakajima et al. .................... 395/130 |

FOREIGN PATENT DOCUMENTS 6-195420   7/1994   (JP) .

\* cited by examiner

Primary Examiner—David Nelms
Assistant Examiner—Thong Le
(74) Attorney, Agent, or Firm—Sughrue, Mion, Zinn, Macpeak & Seas, PLLC

(57) ABSTRACT

A layout data converter (111) is supplied with layout data and prepares segment data. In response to an instruction from an operating section (102), an instruction input device prepares necessary data. In order to move each component in a movement target direction, a terminal constraint graph generator (104) calculates, with reference to the respective data, a moving group relative movement limit length within which one component is movable towards another component with a wire interposed therebetween, subtracts the moving group relative movement limit length from a moving distance of the one component to obtain a difference, and memorizes the difference as a moving distance of the other component. A component compactor (107) moves each component over the moving distance thus obtained. A wire compactor (108) calculates routing limit position data representative of a routing limit position determined by pulling the wire between the components around the other component. A rerouting unit trims the wire and reroutes the wire within the routing limit range.

22 Claims, 24 Drawing Sheets

SEGMENT DATA (TERMINAL AND VIA HOLE)

| | |
|---|---|
| SEGMENT NUMBER | ~31 |
| MOVING GROUP NUMBER | ~32 |
| CONFIGURATION NUMBER | ~36 |
| POSITION NUMBER | ~33 |

FIG.6A

SEGMENT DATA (WIRE AND POLYGONAL CONDUCTOR CONFIGURATION)

| | |
|---|---|
| SEGMENT NUMBER | ~31 |
| CONFIGURATION NUMBER | ~36 |
| POSITION NUMBER (1ST END) | ~33a |
| POSITION NUMBER (2ND END) | ~33b |
| INDICATION OF FIXED OR DEFORMABLE CONFIGURATION | |

FIG.6B

POSITION DATA 34

| | |
|---|---|
| POSITION NUMBER | ~33 |
| X COORDINATE VALUE | |
| Y COORDINATE VALUE | |
| LAYER PLANE NUMBER | |
| MOVING GROUP NUMBER | ~32 |

FIG.6C

CONFIGURATION DATA 35

| | |
|---|---|
| CONFIGURATION NUMBER | ~36 |
| VERTICAL PATTERN WIDTH | |
| HORIZONTAL PATTERN WIDTH | |
| WIDTH IN +45° DIAGONAL DIRECTION | |
| WIDTH IN −45° DIAGONAL DIRECTION | |

FIG.6D

COMPONENT MOVING DISTANCE DATA

INTERFERENCE CALCULATION ARRAY DATA

INTERFERENCE CANCELLATION MOVING DISTANCE DATA

GRAPH PREPARATION RESERVATION ARRAY DATA

SPARE CONSTRAINT GRAPH DATA

CONSTRAINT GRAPH DATA

TERMINAL CONSTRAINT GRAPH DATA

| |
|---|
| GRAPH DIRECTION |
| COMPONENT TERMINAL SEGMENT NUMBER OF 1ST NODE OF GRAPH |
| COMPONENT TERMINAL SEGMENT NUMBER OF 2ND NODE OF GRAPH |
| WIDTH OF ROUTING ZONE |
| MOVING GROUP RELATIVE MOVEMENT LIMIT LENGTH OF 2ND NODE WITH RESPECT TO 1ST NODE |
| NUMBER n OF WIRES TRAVERSED BY GRAPH |
| SEGMENT NUMBER OF 1ST WIRE<br>SEGMENT NUMBER OF 2ND WIRE<br>⋮<br>SEGMENT NUMBER OF n-TH WIRE |

MOVING GROUP GRAPH DATA

| |
|---|
| GRAPH DIRECTION |
| MOVING GROUP NUMBER OF 1ST NODE |
| MOVING GROUP NUMBER OF 2ND NODE |
| MOVING GROUP RELATIVE MOVEMENT LIMIT LENGTH |
| TERMINAL CONSTRAINT GRAPH NAME |

FIG.11B

ROUTING LIMIT POSITION DATA

| |
|---|
| SEGMENT NUMBER OF WIRE |
| SEGMENT NUMBER OF COMPONENT TERMINAL |
| DIRECTION TOWARDS COMPONENT TERMINAL AS SEEN FROM WIRE |
| CONFIGURATION NUMBER OF ROUTING SUPPRESS REGION |
| POSITION NUMBER OF COMPONENT TERMINAL |

FIG.12

TERMINAL GRAPH DATA

| | |
|---|---|
| GRAPH DIRECTION | ~41 |
| COMPONENT TERMINAL SEGMENT NUMBER OF 1ST NODE OF GRAPH | ~31 |
| COMPONENT TERMINAL SEGMENT NUMBER OF 2ND NODE OF GRAPH | ~31 |
| WIDTH OF WIRING ZONE | |
| NUMBER n OF WIRES TRAVERSED BY GRAPH | |
| SEGMENT NUMBER OF 1ST WIRE<br>SEGMENT NUMBER OF 2ND WIRE<br>⋮<br>SEGMENT NUMBER OF n-TH WIRE | ~31 |

FIG.22

WIRE SEGMENT NUMBER

SYSTEM AND METHOD FOR GRAPHIC LAYOUT MODIFICATION

BACKGROUND OF THE INVENTION

This invention relates to a system and a method for graphic layout modification.

In designing a layout of a large-scale semiconductor integrated circuit or a printed wiring board, use is made of an automatic graphic layout modification system.

A conventional automatic graphic layout modification system compresses layout in a longitudinal direction and/or a lateral direction of a board on a display.

However, the conventional automatic graphic layout modification system can not compress the layout in a diagonal direction and can not handle a diagonal wire.

Another conventional automatic graphic layout modification system compresses layout in diagonal direction of a board on a display.

However, the automatic graphic layout modification system can not compress the layout located on a plurality of layers layered on one another.

SUMMARY OF THE INVENTION

It is therefore an object of this invention to provide a graphic layout modification system which is capable of compressing a graphic layout with a plurality of components placed on opposite surfaces on a display.

It is another object of this invention to provide a graphic layout modification system which is capable of performing a compaction in a diagonal direction and achieving a free diagonal wire on a display.

Other object of this invention will become clear as the description proceeds.

On describing the gist of this invention, it is possible to understand that a graphic layout modification system modifies a layout pattern of at least one layer with a plurality of components placed in a two-dimensional space by moving and replacing the components in each layout pattern.

According to the gist of this invention, the system comprises a layout data converting section supplied with layout data representative of the placement of the components for decomposing each component into segments per layer plane to prepare segment data in which those segments belonging to a single common device are assigned with a common moving group number. A movement designating section designates the movement of at least one of the components as a movement-designated component by entering a diagonal movement target direction and an initial moving distance. a calculating section calculates, in order to move the components in the movement target direction, a moving group relative movement limit length within which a first component is movable towards a second component which is adjacent to the first component in the diagonal movement target direction with a wire interposed therebetween. The calculating section subtracts the moving group relative movement limit length from a first moving distance of the first component to obtain a difference and memorizes the difference as a second moving distance of the second component. A moving section moves the components by the second moving distance to place the second component. A wire compacting section calculates routing limit position data representative of a routing limit position determined by pulling the wire between the first and the second components around the second component in the diagonal movement target direction. A rerouting section trims and reroutes the wire within a routing limit range determined by the routing limit position. The components are moved as a chain reaction in the diagonal movement target direction, by substituting the movement-designated component and the initial moving distance for the first component and the first moving distance, respectively, at a first time, and replacing the second component and the second moving distance for a new first component and a new first distance, respectively at and after second times, to obtain a resultant layout which is displayed on a display unit.

According to another gist of this invention, a graphic layout modification method comprises the steps of receiving layout data representative of the placement of the components, decomposing each component into segments per layer plane, and preparing segment data in which those segments belonging to a single common component are assigned with a common moving group number; designating the movement of at least one of the components as a movement-designated component by entering a diagonal movement target direction and an initial moving distance; calculating, in order to move the components in the movement target direction, a moving group relative movement limit length within which a first component is movable towards a second component which is adjacent to the first component in the diagonal movement target direction with a wire interposed therebetween, subtracting the moving group relative movement limit length from a first moving distance of the first component to obtain a difference, and memorizing the difference as a second moving distance of the second component; moving the component by the second moving distance to place the second component; calculating routing limit position data representative of a routing limit position determined by pulling the wire between the first and the second components around the second component in the diagonal movement target direction; and trimming and replacing the wire within a routing limit range determined by the routing limit position. The components are moved as a chain reaction in the diagonal movement target direction, by substituting the movement-designated component and the initial moving distance for the first component and the first moving distance, respectively, at a first time, and replacing the second component and the second moving distance for a new first component and a new first distance, respectively at and after second times, to obtain a resultant layout which is displayed on a display section.

According to still another gist of this invention, an information recording medium records a layout data converting program supplied with layout data representative of the placement of the components for decomposing each component into segments per layer plane to prepare segment data in which those segments belonging to a single common component are assigned with a common moving group number; movement designating program for designating the movement of at least one of the components as a movement-designated component by entering a diagonal movement target direction and an initial moving distance; a program for calculating, in order to move the components in the movement target direction, a moving group relative movement limit length within which a first component is movable towards a second component which is adjacent to the first component in the diagonal movement target direction with a wire interposed therebetween, for subtracting the moving group relative movement limit length from a first moving distance of the first component to obtain a difference, and for memorizing the difference as a second moving distance of the second component; a program for moving the components by the second moving distance to place the second component; a wire compacting program for calculating routing limit position data representative of a routing limit position determined by pulling the wire between the first and the second components around the second component in the diagonal movement target direction; and a rerouting program for trimming and replacing the wire within the routing limit range determined by the routing limit position; the components being moved as a chain reaction in the diagonal movement target direction, by substituting the movement-designated component and the initial moving distance for the first component and the first moving distance, respectively, at a first time, and replacing the second component and the second moving distance for a new first component and a new first distance, respectively at and after second times, to obtain a resultant layout which is displayed on a display section.

BRIEF DESCRIPTION OF THE DRAWING

FIGS. 6A to 6D show data structures of various data used in the graphic layout modification system illustrated in FIG. 3, including segment data for a component terminal or a via hole, segment data for a wire, a polygonal conductor configuration, or a board contour, position data, and configuration data, respectively;

FIGS. 11A and 11B show data structures of terminal constraint graph data and moving group net graph data, respectively;

FIG. 12 shows a data structure of routing limit position data;

FIG. 22 shows a data structure of terminal graph data;

DESCRIPTION OF PREFERRED EMBODIMENTS

Figure 1:
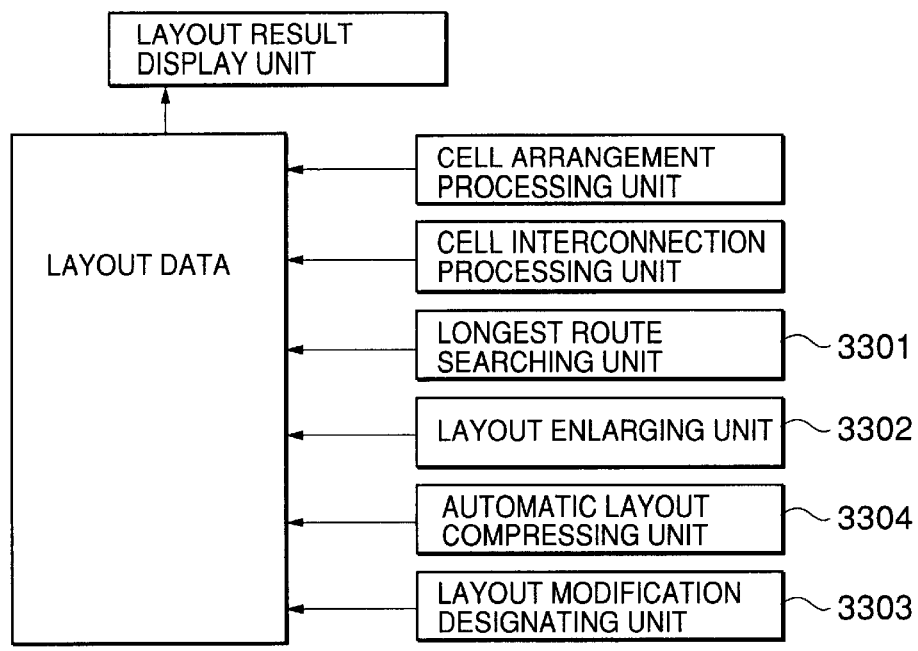
FIG. 1 is a block diagram of a conventional LSI layout compressing apparatus.

Referring to FIG. 1, description will be at first directed to a conventional graphic layout modification system for a better understanding of this invention.

The conventional graphic layout modification system is disclosed in Japanese Unexamined Patent Publication (JP-A) No. 1-279373 (279373/1989) as an LSI layout compressing apparatus.

As illustrated in FIG. 1, the LSI layout compressing apparatus comprises a longest route searching unit 3301, a layout enlarging unit 3302, a layout modification designating unit 3303, and an automatic layout compressing unit (or a compaction unit) 3304.

Figures 2A, 2B:
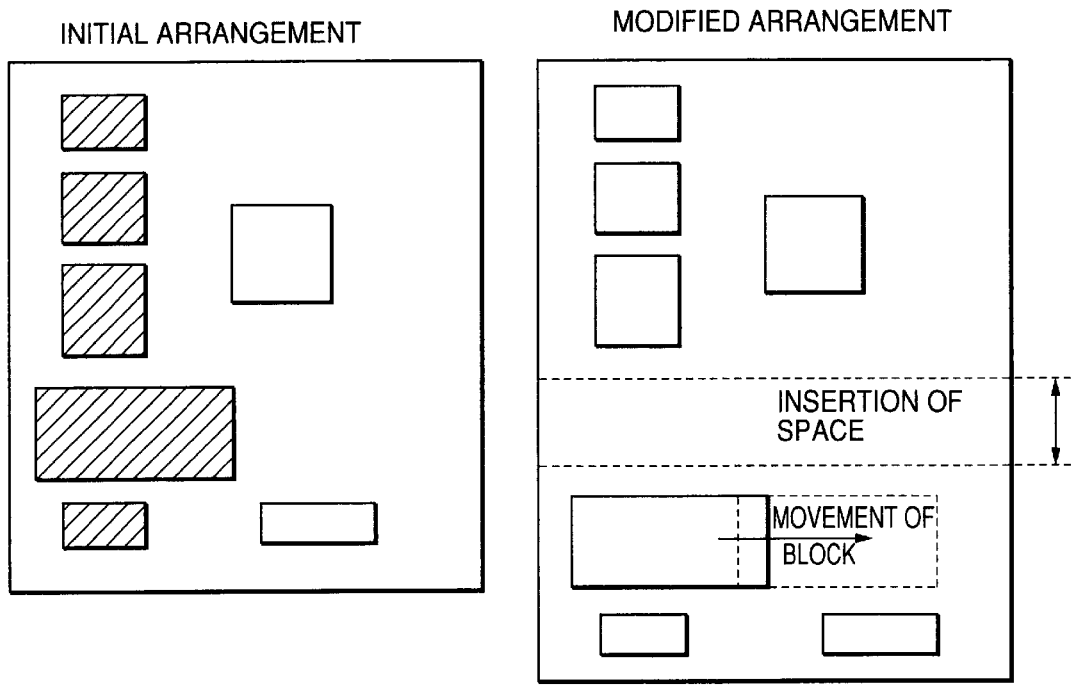
FIGS. 2A and 2B are views for describing an operation of the conventional LSI layout compressing apparatus in FIG. 1.

Referring to FIGS. 2A and 2B, the operation of the LSI layout compressing apparatus will be described. FIGS. 2A and 2B show layouts of blocks (or graphic elements) on an LSI chip. Each of the blocks includes one or more cells and inner wires which connect the cells one another. The layouts are displayed on a display unit of the LSI layout compressing apparatus.

For the purpose of compressing the layout shown in FIG. 1, the longest route searching unit 3301 searches a longest route in the layout. The longest route consists of the blocks and wires (not shown) which connect the blocks one another. Then, the longest route searching unit 3301 searches a longest series of the blocks along a compaction direction (ex. a longitudinal direction) in the longest route. The display unit displays the longest series of the components, as depicted by hatched regions in FIG. 2A.

As illustrated in FIG. 2B, the layout enlarging unit 3302 inserts a space traversing the longest series in response to an instruction from an operator.

The layout modification designating unit 3303 is responsive to another instruction from the operator and moves an object block out of the longest series so as to shorten the longest series. In the example illustrated in FIG. 2B, a second block from the bottom is the object block and moved rightward.

The automatic layout compressing unit 3304 compresses a resultant layout after the above-mentioned movement. In FIG. 2B, the resultant layout is compressed in the compaction direction.

In the above-mentioned LSI layout compressing apparatus, however, it is impossible to perform such compaction that the blocks are moved as a chain reaction (or in cooperation) in a diagonal or oblique direction. Namely, the blocks except for the object are moved only in the longitudinal direction (or the lateral direction). This is because the constraint graph is prepared only in the longitudinal direction (or the lateral direction) of a board.

As another example of the conventional graphic layout modification system, a layout compaction method is disclosed in Japanese Unexamined Patent Publication (JP-A) 5-274392 (274392/1993).

In a layout compression system adopting the layout compaction method, a board is divided into a plurality of partial areas separated by wires as boundaries. Each partial area is compressed by a partial pattern compressing section. The partial pattern compressing section compresses the partial area in a lateral direction from a left end of the board and in a longitudinal direction from an upper end of the board. Thus, a whole area of the board is uniformly compacted with longitudinal and lateral relationships between the partial areas maintained.

According to the above-mentioned layout compaction method, it is possible to compress the partial areas of the board by partial compaction. However, this method is based on the assumption that the wires are routed (or wired) in the longitudinal and the lateral directions. By compressing the wires in the longitudinal and the lateral directions, the partial areas are compressed. Thus, diagonal wires can not be used.

As a layout modification method by the automatic graphic layout modification system of the type, proposal has been made of various kinds of compaction techniques in which a plurality of blocks in a layout are moved as a chain reaction. For example, a technique called jog-insert compaction is proposed by W. Yamamoto et al in their articles "A Chip Compaction Method on Constraint Graph and the Experimental Result", Technical Report of IEICE, VLD91-43, pp. 41–48, 1991 (Article 1), "A Chip Spacing Method for Layouts with Design-Rule Violations", Technical Report of IEICE, VLD91-120, pp. 37–44, Feb. 7, 1992 (Article 2), and "A Chip Spacer with Automatic 45° Diagonal Routing Generation", Technical Report of IEICE, VLD91-123, pp. 17–24, 1992 (Article 3). In these techniques, bends or turns called jogs are inserted into wires to change a structure or condition of a constraint graph so that a layout area is further reduced and design-rule violations are corrected.

Among these proposals, the technique disclosed in Article 3 can deal with diagonal wires. It is therefore possible to prepare a constraint graph in a diagonal direction and to perform compaction in the diagonal direction.

However, the above-mentioned technique is disadvantageous in the following respects.

First, free and independent movement of blocks (ex. device, cell, circuit, etc.) is difficult, for example, in case where a printed wiring board has two blocks placed on one and the other surfaces thereof each and these blocks are connected to each other by a through hole terminal through a through (or via) hole formed in the printed wiring board.

This is because components are handled as the blocks (or graphic elements), each of which is consist of one or more components, and compaction is performed by changing the positional relationship between the blocks.

Second, if compaction in the diagonal direction is performed according to this method, the wires are pulled in the compaction direction. Thus, the configuration of the wires are biased in the compaction direction and the wires can not be formed into a free diagonal shape.

The reason is as follows. In the conventional system, the wire is bent with jogs inserted therein and pulled in the compaction direction to a maximum extent to form a rough configuration which is then modified and trimmed. Accordingly, it is difficult to widely modify the wire configuration Besides above mentioned compaction systems, various compaction systems or methods are disclosed and have been proposed. For example, a compaction method is disclosed in Japanese Unexamined Patent Publication (JP-A) 10-3491 (3491/1998). In addition, a proposal is made by K. Sakanushi et al in their article "Concurrent Representation and Optimization of Placement and Route on BSG", Technical Report of IEICE, CAS97-40, pp. 175–182, 1997-06.

These techniques can move blocks in a diagonal direction one by one. However, it is impossible to perform such compaction that the blocks are moved as a chain reaction (or in cooperation) in the diagonal direction. In addition, these techniques are based on the assumption that the wires are routed in longitudinal and lateral directions. Accordingly, diagonal wires can not be used in these techniques.

Referring to FIGS. 3 through 15, the description will proceed to a graphic layout modification system according to preferred embodiments of this invention.

At first, the graphic layout modification system according to a first embodiment of this invention will be briefly described below.

The graphic layout modification system can move a plurality of components in a pattern formed on one or more layers of a printed circuit board in a diagonal direction as a chain reaction. The components are a wire, a terminal (include input and output terminals and a device terminal), a via hole (or a through hole), and a polygonal conductor configuration such a semiconductor cell, and so on.

Figure 3:
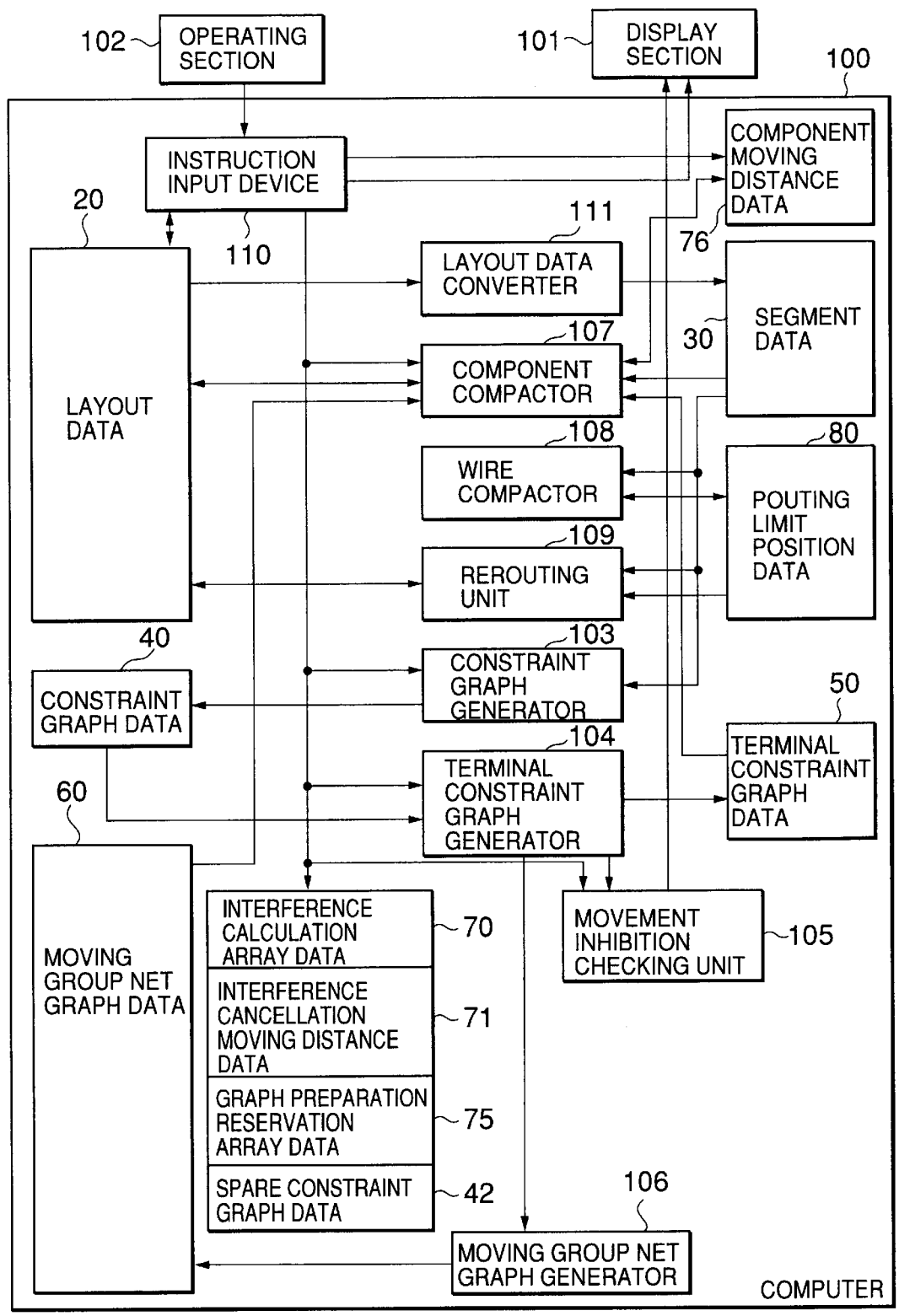
FIG. 3 is a block diagram of a graphic layout modification system according to a first embodiment of this invention.

In FIG. 3, the system comprises a constraint graph generating unit 103 supplied with layout data 20 for preparing diagonal-direction constraint graph data 40. Each component is decomposed into at least one segment. With respect to those segments of the components which are adjacent to each other in the diagonal direction, the diagonal-direction constraint graph data 40 records routing zone widths each of which is equal to a sum of widths of two segments, the width of the wires interposed therebetween, and necessary gaps. A component compactor 107 moves the segments in cooperation in longitudinal, transversal, and diagonal directions. The components are moved as chain reaction in the diagonal direction.

A terminal constraint graph generator 104 prepares terminal constraint graph data 50 with component terminals (except wires, include terminals and via holes) included as nodes. Calculation is made of a limit moving distance within which one node of the terminal constraint graph data 50 is movable towards the other node in a moving direction 61 with the routing zone interposed therebetween. The routing zone is a sum of the width of the wires interposed therebetween and the necessary gaps. Component terminals belonging to the same device (or cell, circuit, via hole, etc.) are moved together with one another. These component terminals moved together are called a moving group. The limit moving distance is memorized as a moving group relative movement limit length 51. The component compactor 107 moves those component terminals of the moving group in cooperation in the moving direction 61 together to perform compaction.

Thus, compaction in the diagonal direction is enabled.

Now, the graphic layout modification system according to the first embodiment of this invention will be described in detail with reference to the drawings.

Referring to FIG. 3, the graphic layout modification system comprises a computer 100 operated under control of a program, a display section 101, and an operating section 102. The computer 100 may comprise a central processing unit, a processor, or a data processor. The display section 101 may comprise a CRT display or a liquid crystal display. The operating section 102 may comprise a keyboard, a mouse, a tablet, or a combination thereof.

The computer 100 comprises a layout data converter 111, an instruction input device 110, the constraint graph generator 103, the terminal constraint graph generator 104, a movement inhibition checking unit 105, a moving group net graph generator 106, the component compactor 107, a wire compactor 108, a rerouting unit 109, a layout data memory 20, a segment data memory 30, a constraint graph data memory 40, a terminal constraint graph data memory 50, a moving group net graph data memory 60, an interference calculation array data memory 70, an interference cancellation moving distance data memory 71, a graph preparation reservation array data memory 75, a component moving distance data memory 76, and a routing limit position data memory 80. The layout data converter 111, the constraint graph generator 103, the terminal constraint graph generator 104, the movement inhibition checking unit 105, the moving group net graph generator 106, the component compactor 107, the wire compactor 108, and the rerouting unit 109 may be provided by the program.

Supplied with layout data stored in the layout data memory 20, the layout data converter 111 decomposes the layout data into segment data to be memorized in the segment data memory 30.

With respect to each segment of terminals, via holes, wires, or a polygonal conductor configurations, the constraint graph generator 103 extracts another segment of another terminal, another via hole, another wire, or another polygonal conductor configuration which is adjacent thereto in a moving direction designated by an operator, and prepares constraint graph data connecting those segments adjacent to each other. The constraint graph data are memorized in the constraint graph data memory 40.

The terminal constraint graph generator 104 calculates a moving group relative movement limit length within which a moving device is allowed to move towards adjacent ones of device terminals, via holes (except wires), and device contours in the neighborhood in the moving direction. The terminal constraint graph generator 104 prepares terminal constraint graph data including as opposite nodes a pair of component terminals (or segments) related with each other by the movement of the moving device, and the moving group relative movement limit length. The terminal constraint graph data are memorized in the terminal constraint graph data memory 50.

With respect to the terminal constraint graph data, the moving group net graph generator 106 prepares moving group net graph data including moving group numbers of the segments at the opposite nodes, and the moving group relative movement limit length.

The component compactor 107 calculates moving distances of the devices and the via holes. Among routes connected by the moving group net graph data, selection is made of a shortest route which provides a smallest sum of moving group relative movement limit lengths in based on a moving group number at a start point of the movement. The value of the moving distance of the moving group is calculated and memorized. The components are moved by the moving distance. Specifically, the component compactor 107 carries out partial compaction to compact those component groups connected by the moving group net graph alone.

The wire compactor 108 prepares routing limit position data representative of a routing limit position. Specifically, with respect to the terminal constraint graph data having a previously moved device terminal and/or a previously moved via hall at opposite ends thereof with the wire interposed therebetween, the routing limit position is defined by pulling the wire around the one end of the terminal constraint graph data and bending the wire in the form of an octagonal configuration. The routing limit position data are memorized in the routing limit position data memory 80.

Within the limitation of the routing limit position data, the rerouting unit 109 trims the wire into a configuration including diagonal parts and reroutes (or rewires) the wire. A resultant layout is memorized in the layout data memory 20.

Next referring to FIGS. 3 through 12, the operation of the graphic layout modification system of this embodiment will be described.

Figure 4:
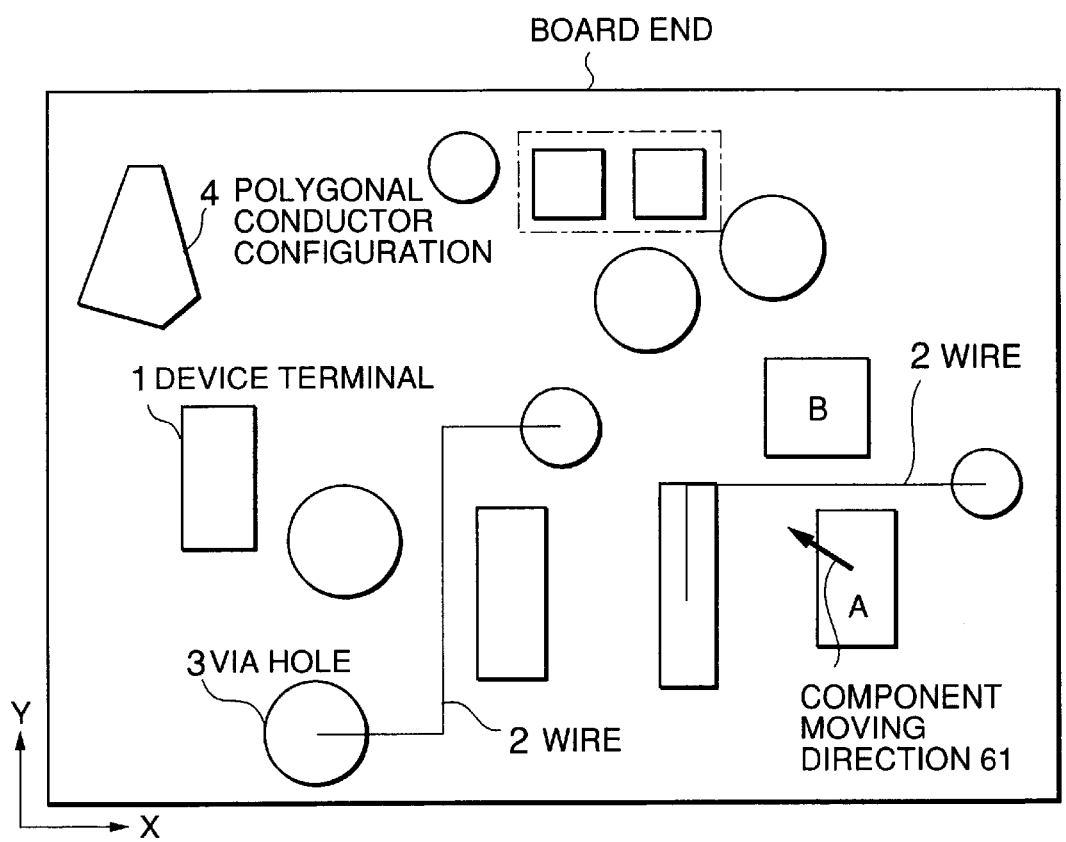
FIG. 4 shows an example of a graphic layout to which the graphic layout modification system in FIG. 3 is applicable.

Referring to FIG. 4, a printed wiring board to be subjected to layout modification has an initial layout illustrated in the figure. As illustrated in FIG. 4, the layout of the printed wiring board includes a board end (board contour) depicted by a large rectangle delineated at an outermost position in the figure. Within the board, a device terminal 1 as a smaller rectangle, a wire 2 as a combination of continuous line segments, a via hole 3 as a circle, and a polygonal conductor configuration as a polygon are placed. Hereinafter, they are collectively referred to as components. Moreover, the device terminal 1 and the via hole 3 are collectively referred to as component terminals.

Such layout is memorized in the layout data memory 20 as layout data. In the initial layout of the printed wiring board, a gap between each of the component terminal 1, the wire 2, the via hole 3, and the polygonal conductor configuration 4 and another adjacent component may be smaller than a minimum gap in a design rule. Such a smaller gap can be corrected in a process of operation of the system according to this embodiment.

Figure 5:
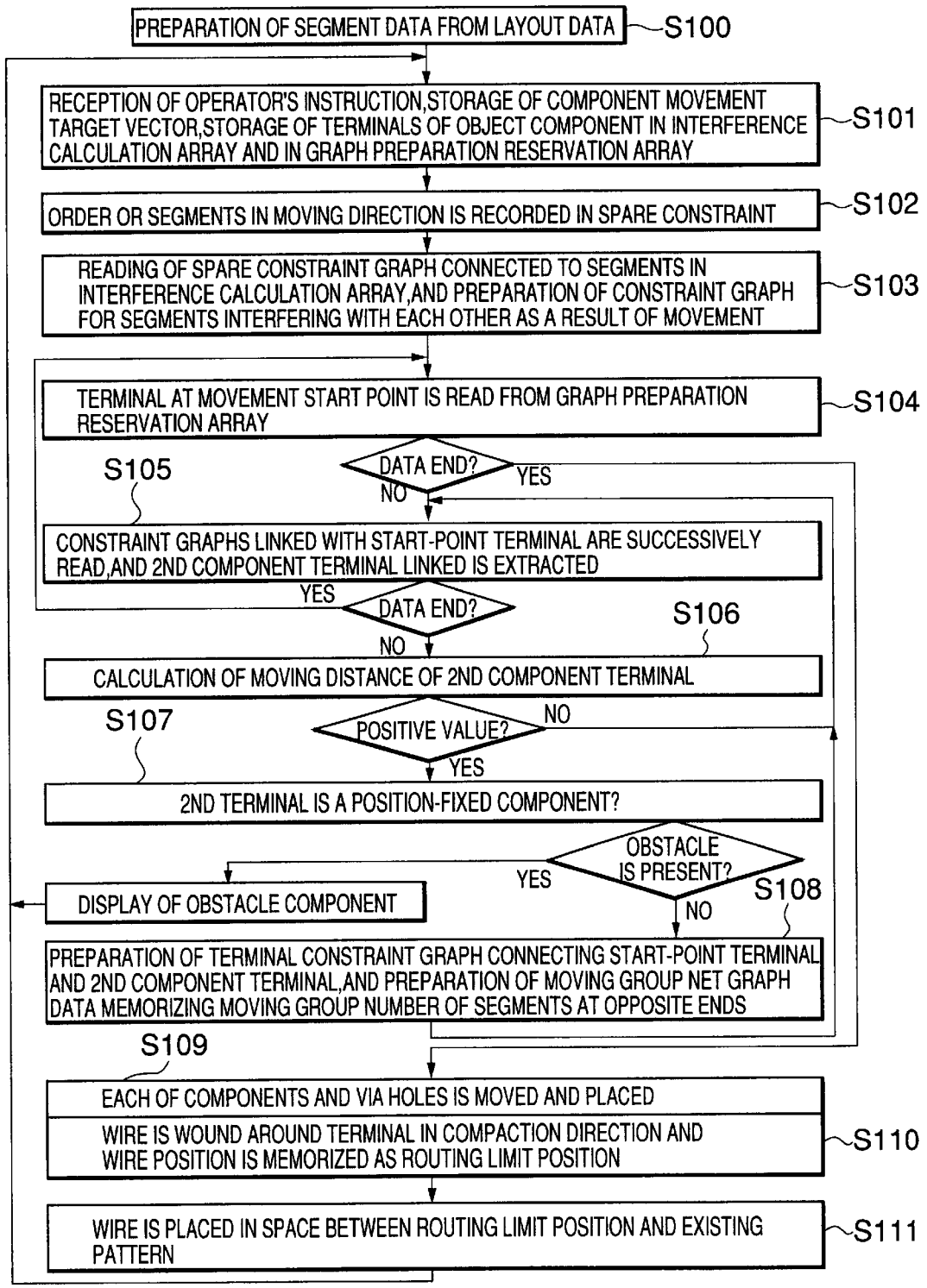
FIG. 5 is a flow chart for describing an operation of the graphic layout modification system illustrated in FIG. 3.

Referring to FIG. 5, the operation will be described.

In a step S100, the layout data converter 111 is supplied with the layout data memorized in the layout data memory 20 and prepares the segment data to be stored in the segment data memory 30.

Specifically, the layout data converter 111 is responsive to the layout data memorized in the layout data memory 20 and decomposes per layer plane (each layer of the multi-layer printed wiring board) the component terminal 1, the wire 2, the via hole 3, the polygonal conductor configuration 4, and the board contour forming the layout pattern. For the device terminal 1 and the via hole 3, segment data are prepared in the manner such that each single terminal or each single hole is treated as a single segment whose configuration is approximated to an octagonal shape. The wire 2 is decomposed into line segments each of which extends from one corner or intersection to a next corner or intersection. Each of the board contour and the polygonal conductor configuration 4 is decomposed into respective sides. Thus, the segment data are prepared for each component. The layout data converter 111 supplies the segment data thus prepared to the segment data memory 30 to be stored therein.

The segment data stored in the segment data memory 30 include various kinds of information illustrated in FIGS. 6A and 6B. Specifically, the segment data for each of the device terminal 1 and the via hole 3 include a segment number 31, a moving group number 32, a configuration number 36, and a position number 33, as illustrated in FIG. 6A. The segment data for each of the wire 2, the polygonal conductor configuration 4, and the board contour include the segment number 31, the configuration number 36, a position number (first end: start end) 33a, another position number (second end: terminating end) 33b, and an indication of fixed configuration or deformable configuration, as illustrated in FIG. 6B.

The segment number 31 included in the segment data is a number uniquely assigned to each segment. As the moving group number 32, a single common number is assigned to all of those terminals related to a single device (or a circuit and so on). In case of the via hole, segment data of all layer planes are assigned with a single common number as the moving group number 32.

The position number 33 is a number assigned to position data 34 illustrated in FIG. 6C. The position data 34 include the position number 33 assigned thereto, X and Y coordinates indicative of the position, a layer plane number, and the moving group number 32. In order to identify the X and the Y coordinates, appropriate X and Y axes are preliminarily determined (generally, two axes parallel to two sides of the board contour and perpendicular to each other with an origin located outside of the board contour are used as illustrated in FIG. 4). As the position number for a particular wire, use is made of the position number of the device terminal or the via hole if the particular wire is connected thereto. If the particular wire is connected to another wire, the position number of another wire is used as the position number of the particular wire. The position data 34 include the moving group number 32. Therefore, if the particular wire is connected to the device terminal or the via hole, the movement of the particular wire can be moved following the movement thereof.

The configuration number 36 for the component terminal 1 and the via hole 3 is a number assigned to the configuration data 35 illustrated in FIG. 6D prepared upon preparation of the segment data. As described above, each of the component terminal 1 and the via hole 3 is approximated to an octagonal shape. Therefore, the configuration data 35 include pattern widths in longitudinal, lateral, +45° diagonal, and −45° diagonal directions-defining the octagonal shape (longitudinal and lateral directions correspond to the Y and the X axis directions in FIG. 4, respectively). On the other hand, the configuration number 36 of the wire 2 is a number representing the predetermined width of the wire. For the polygonal conductor configuration, the indication of the fixed configuration is included without using the configuration number.

Next, in a step S101, the instruction input device 110 is responsive to an operator's instruction and memorizes a movement target vector of a device, memorizes predetermined information about device terminals of the device in an interference calculation array 70 and in a graph preparation reservation array 75.

Figure 7A:
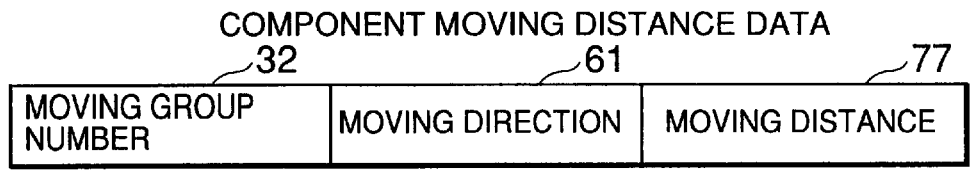
FIGS. 7A to 7D show data structures of component moving distance data, interference calculation array data, interference cancellation moving distance data, and graph preparation reservation array data, respectively.

Specifically, when the operator operates the operating section 102, i.e., enters the movement target vector of the device for the layout in FIG. 4, for example, by dragging the mouse, the instruction input device 110 recognizes the entry of the vector and displays the vector on the display section 101. Simultaneously, the instruction input device 110 calculates from the movement target vector a movement target direction 61 and a movement target distance. As illustrated in FIG. 7A, component moving distance data including the moving group number 32 of the object components, the moving direction 61, and a moving distance 77 are prepared and stored in the component moving distance data memory 76.

Figure 7B:
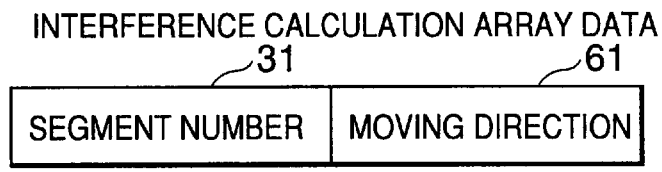
Figure 7C:
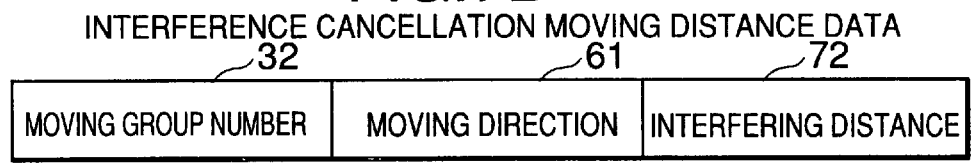
Figure 7D:
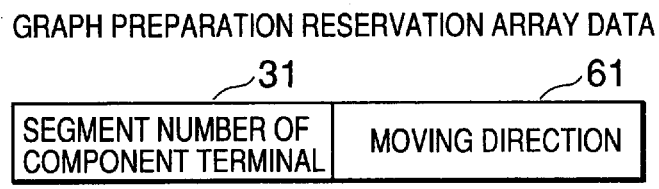

The instruction input device 110 prepares interference calculation array data including the segment number 31 of each object component to be moved and the moving direction 61, as illustrated in FIG. 7B. The interference calculation array data are stored in the interference calculation array data memory 70. The instruction input device 110 prepares interference cancellation moving distance data including the moving group number 32, the moving direction 61, and an interference distance (initial value being moving distance) 72. The interference cancellation moving distance data are memorized in the interference cancellation moving distance data memory 71. Furthermore, the instruction input device 110 prepares graph preparation reservation array data including the segment number 31 of the object component and the moving direction 61. The graph preparation reservation array data are stored in the graph preparation reservation array data memory 75.

Supplied with an instruction to fix a position of a particular component, the instruction input device 110 makes position-fix information of the object segment(s) be memorized in a memory (not shown) of the movement inhibition checking unit 105.

Supplied with an instruction to add a new wire or a new component such as a via hole, the instruction input device 110 can designate a movement vector of each component located around a position of the new component so that a predetermined interval is kept from the new component.

Figure 8A:
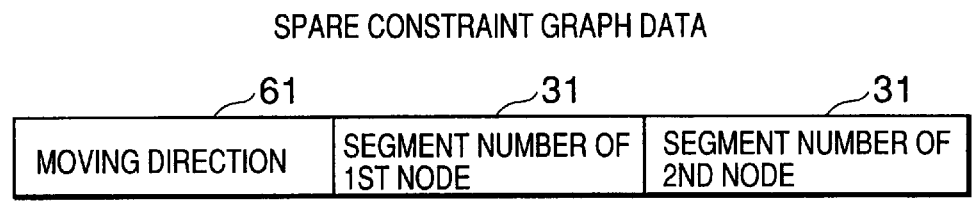
FIGS. 8A and 8B show data structures of spare constraint graph data and constraint graph data, respectively.

In a step S102, the constraint graph generator 103 determines, for the segments indicated by all segment data memorized in the segment data memory 30, the order of placement in the movement target direction with reference to the coordinate values of the component in relation to the movement target direction. For example, in case of the movement in the −45° diagonal direction which is a direction declining rightward by 45° from the lateral direction, a difference (Y−X) is calculated for each segment data by the use of the X and the Y coordinate values of the position data indicated by the position number of each segment data. The difference provides the order of each segment (i.e., the coordinate value related to the movement target direction). Specifically, when the calculated value is smaller and greater, the order is higher and lower, respectively. Once the order of placing the segments is determined as described above, the terminal constraint graph generator 103 prepares spare constraint graph data including the moving direction 61, the segment number 31 of a first node, and the segment number 31 of a second node as illustrated in FIG. 8A. The spare constraint graph data are memorized in a spare constraint graph data memory 42. Herein, the first segment number 31 is a segment number of one of adjacent components which has a higher order while the second segment number 31 is a segment number of the other having a lower order. Therefore, by memorizing the spare constraint graph data in the spare constraint graph data memory 42, the order of the adjacent segments in the moving direction 61 is recorded.

In a step S103, the constraint graph generator 103 reads the interference calculation array data (see FIG. 7B) from the interference calculation array data memory 70 and extracts its segment number 31 as a segment number of a object segment of movement. By the use of the segment number, the segment data memory 30 is searched to obtain the moving group number 32 of the object segment. Subsequently, by the use of the segment number 31 and the moving group number 32 of the object segment, an interference distance 72 corresponding to the object segment is read from the interference cancellation moving distance data memory 71. Furthermore, the constraint graph generator 103 searches the spare constraint graph data memory 42 to extract the segment number 31 of an adjacent segment adjacent to the object segment. The extraction of the adjacent segment is carried out per each moved segment and its moving direction 61 when a moving instruction is given to a plurality of components.

Figure 8B:
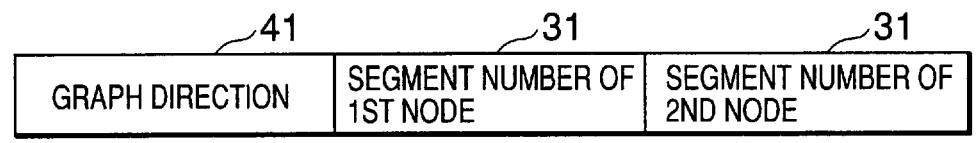

Then, the constraint graph generator 103 calculates whether or not an interference is caused to occur between the object segment and the adjacent segment in case where the object segment is moved in the moving direction 61 by the interference distance 72. If the result of calculation indicates the occurrence of the interference, the constraint graph data are prepared and memorized in the constraint graph data memory 40. As illustrated in FIG. 8B, the constraint graph data include a graph direction 41 and the segment numbers of the first and the second nodes. The graph direction 41 is coincident with the moving direction 61. The segment number of the first node is a segment number of the adjacent segment which interferes (hereinafter called interfering segment) while the segment number of the second node is a segment number of the object segment. The constraint graph generator 103 prepares interference calculation array data including the segment number of the interfering segment and makes the interference calculation array data memory 70 memorize the interference calculation array data. A moving direction included in the interference calculation array data is made to coincide with the graph direction 41 (herein, coincident with the moving direction 61).

The constraint graph generator 103 calculates the moving distance required for the interfering segment to become free from interference even after the movement of the object segment by the interference distance 72. The calculated moving distance is used as an interference distance 72 for the interfering segment. If the interfering segment is a segment (device terminal, via hole) other than the wire and if the interference cancellation moving distance data (see FIG. 7C) including the moving group number 32 related to the segment number 31 are present in the interference cancellation moving distance data memory 71, the calculated interference distance is compared with the interference distance 72 included in the existing data. If the calculated interference distance is greater, the interference cancellation moving distance data is updated by the use of the calculated value. If the calculated interference distance is smaller, the interference cancellation moving distance data are not updated. On the other hand, the interference cancellation moving distance data including the moving group number 32 are not yet prepared, new interference cancellation moving distance data including the moving group number 32, the moving direction 61, and the interference distance 72 are prepared and memorized in the interference cancellation moving distance data memory 71. Then, the constraint graph generator 103 extracts from the segment data memory 30 all segment data including the moving group number 32, and prepares interference calculation array data including the segment numbers 31 contained in the extracted segment data and the moving directions 61 thereof. The interference calculation array data are memorized in the interference calculation array data memory 70.

Upon completion of the above-mentioned operation, the constraint graph generator 103 again reads unprocessed interference calculation array data from the interference calculation array data memory 70, and performs the above-mentioned operation. The operation is repeated until no unprocessed data is left in the interference calculation array data memory 70.

In a step S104, the component compactor 107 reads the graph preparation reservation array data from the graph preparation reservation array data memory 75. A component indicated by a segment number included in the graph preparation reservation array data thus read is extracted as a first terminal. Then, the operation proceeds to a step S105. On the other hand, if no unprocessed graph preparation reservation array data are present in the graph preparation reservation array data memory 75 and the component compactor 107 can not read the graph preparation reservation array data, the operation proceeds to a step S109.

In the step S105, the terminal constraint graph generator 104 is supplied from the component compactor 107 with a notification of the first terminal and searches the constraint graph data memory 40 to find the segment number 31 of the segment influenced by the movement of the first terminal. The segment number 31 thus obtained is used as a second terminal. After extraction of the second terminal, the operation proceeds to a step S106. When all second terminals are extracted and processed, the operation returns to a step S104.

Figure 9:
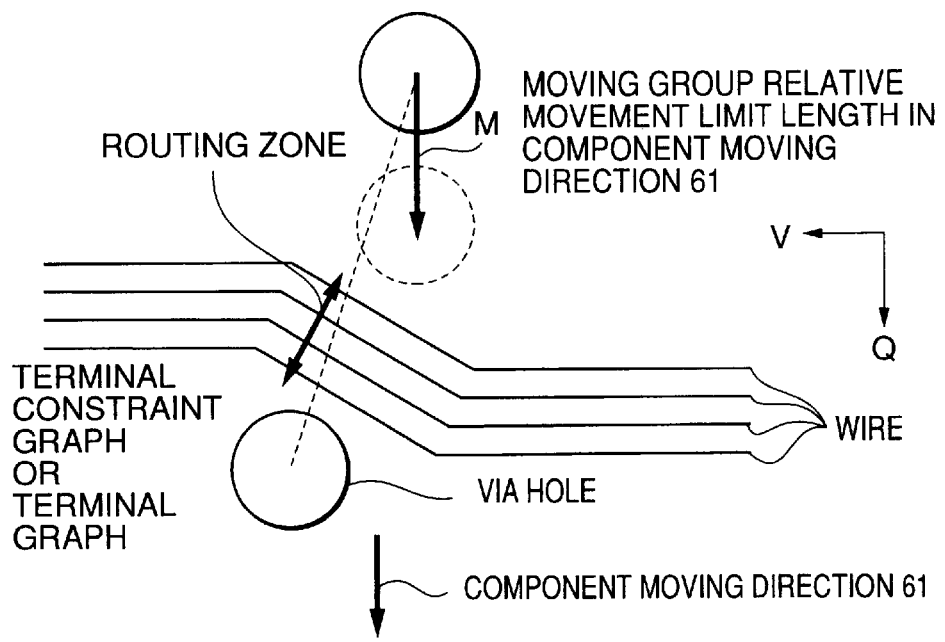
FIG. 9 is a view for describing calculation of a moving group relative movement limit length.
Figure 10:
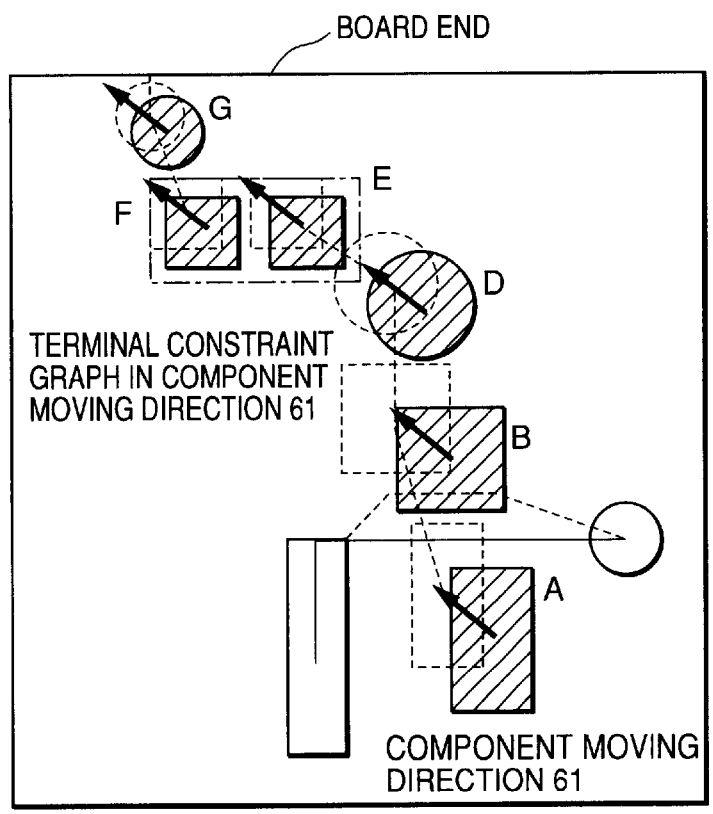
FIG. 10 is a view for describing highlightened display in a display section.

In the step S106, the terminal constraint graph generator 104 calculates the routing zone width which is a sum of the width of the wires interposed between the first and the second terminals and the necessary gaps for placing the wires, and calculates a moving group relative movement limit length M. The moving group relative movement limit length M is a limit within which the first terminal is movable in the moving direction 61 with the routing zone interposed therebetween. The routing zone is freely obliquely bendable as will later be described. Specifically, a coordinate axis in the component moving direction 61 is labelled a Q axis (longitudinal direction in the figure) while another direction perpendicular thereto is labelled a V axis, as illustrated in FIG. 9. Then, a relative coordinate (V, Q) between the first terminal (herein, an upper via hole) and the second terminal (herein, a lower via hole) is obtained. The sum of the radii of the both terminals in the direction V and the routing zone width in the direction V is represented by Bv. Likewise, the sum of the radii of the both terminals in the direction Q and the routing zone width in the direction Q is represented by Bq. The sum of the radii and the routing zone width as a measure from the center of the one terminal to the other terminal is represented by Bz, when the both terminals are projected onto the coordinate V+Q. The sum of the radii and the routing zone width as a measure from the center of the one terminal to the other terminal is represented by Bw, when the both terminals are projected on the coordinate Q−V. The minimum value of M is calculated by the following equations. The minimum value thus calculated is the moving group relative movement limit length M.

$-Bv<V<Bv$
$U<=Bq$
$U<=Bz-V$
$U<=Bw+V$
$M=Q-U$

Subsequently, the terminal constraint graph generator 104 calculates a difference obtained by subtracting the moving group relative movement limit length M from the moving distance 77 of the component to which the first terminal belongs. If the difference has a positive value, a component (hereinafter called a neighbor component) to which the second terminal belongs is moved by a distance equal to the difference as a chain reaction. Thus, the moving distance of the second terminal is obtained. If the difference is equal to zero or a negative value, the neighbor component need not be moved. If the difference is a positive value, the operation proceeds to a step S107. Otherwise, the operation returns to the step S105.

In the step S107, the movement inhibition checking unit 105 confirms presence or absence of the position-fix indication of the neighbor component with reference to the information memorized in an internal memory (information supplied from the instruction input device). In presence of the position-fix indication for the neighbor component, this component interferes with the movement of the second terminal. In this event, those components from the neighbor component to the component at a start point of the movement are traced by the use of the moving group net graph data which will later be described. Those components involved in the chain reaction are displayed on the display section 101 in a highlightened mode to inform the operator of presence of an obstacle. For example, if the board contour is fixed and the movement of a component adjacent to the board end results in an interference with the board end, those components involved in the chain reaction are displayed on the display section 101 in a highlightened mode (depicted by hatching in the figure). Thereafter, the operation returns to the step S101. On the other hand, in absence of the position-fix indication for the neighbor component, the operation proceeds to a step In the step S10B, the terminal constraint graph generator 104 prepares terminal constraint graph data having the first and the second terminals at opposite ends. The terminal constraint graph data are memorized in the terminal constraint graph data memory 50. As illustrated in FIG. 11A, the terminal constraint graph data include the graph direction 41, the component terminal segment numbers of the first and the second nodes of the graph, the routing zone width, the moving group relative movement limit length of the second node with respect to the first node, the number n of wires traversed by the graph, and the segment numbers 31 of these wires. Herein, the graph direction 41 is coincident with the component moving direction 61. The component terminal segment numbers of the first and the second nodes correspond to the segment numbers of the first and the second terminals.

Simultaneously, the moving group net graph generator 106 prepares the moving group net graph data which are memorized in the moving group net graph data memory 60. As illustrated in FIG. 11B, the moving group net graph data include the graph direction 41, the moving group number of the first node, the moving group number of the second node, the moving group relative movement limit length, and a terminal constraint graph name. Again, the graph direction 41 is coincident with the moving direction 61. The moving group numbers of the first and the second nodes correspond to the moving group numbers of the first and the second terminals, respectively. If the moving group net graph data including the same graph direction, and the same moving group numbers of the first and the second nodes are already present, updating is performed to select one of the data having a smaller value of the moving group relative movement limit length.

Then, the component compactor 107 calculates a difference obtained by subtracting from the moving distance 77 of the component of the first terminal the moving group relative movement limit length M of the moving group net graph data 60 of the neighbor component. The difference is compared with the component moving distance 77 included in the component moving distance data (see FIG. 7A) of the neighbor component. If the calculated difference is greater than the component moving distance included in the memorized data, the component moving distance 77 of the component moving distance data of the neighbor component is updated. Then, a set of combinations of each component related to the neighbor component and moving directions 61 is recorded in the graph preparation reservation array data 75. Thereafter, the operation returns to the step S105.

In a step S109, the component compactor 107 moves each component by the component moving distance 77 with reference to the component moving distance data and replaces each component.

Next, in a step S110, the wire compactor 108 prepares the configuration data (see FIG. 6D) of the routing suppress region with reference to the terminal constraint graph data in the terminal constraint graph data memory 50. Specifically, the wires are moved in the moving direction 61 sequentially from the one located forward in the moving direction, and are bent in the longitudinal, the lateral, and the diagonal directions along the configuration of the component or the existing wire located forward in the moving direction 61. As a result, the wire configuration has an octagonal shape formed by pushing the routing zone, which spans from the wire to the component (core terminal) located forward in the moving direction 61, towards the component and bending the routing zone along the configuration of the component. The wire compactor 108 prepares the routing limit position data which are memorized in the routing limit position data memory 80. As illustrated in FIG. 12, the routing limit position data include the segment number 31 of the wire, the segment number 31 of the component, a connecting direction 81 from the wire to the component, the configuration number 36 of the routing suppress region, and the position number 33 of the component.

In a step S111, the rerouting unit 109 routes (or wires), with reference to the constraint graph data, the moved wires successively from the one near to the component at the movement start point. Specifically, the routing limit position data prepared by the wire compactor 108 are used as the routing limit position in the component moving direction 61. In a reverse direction reverse to the component moving direction, the wires are rerouted between those wires rerouted earlier and other segments with an allowable gap kept therefrom.

As described above, modification of the graphic layout is carried out according to this embodiment.

Figure 13:
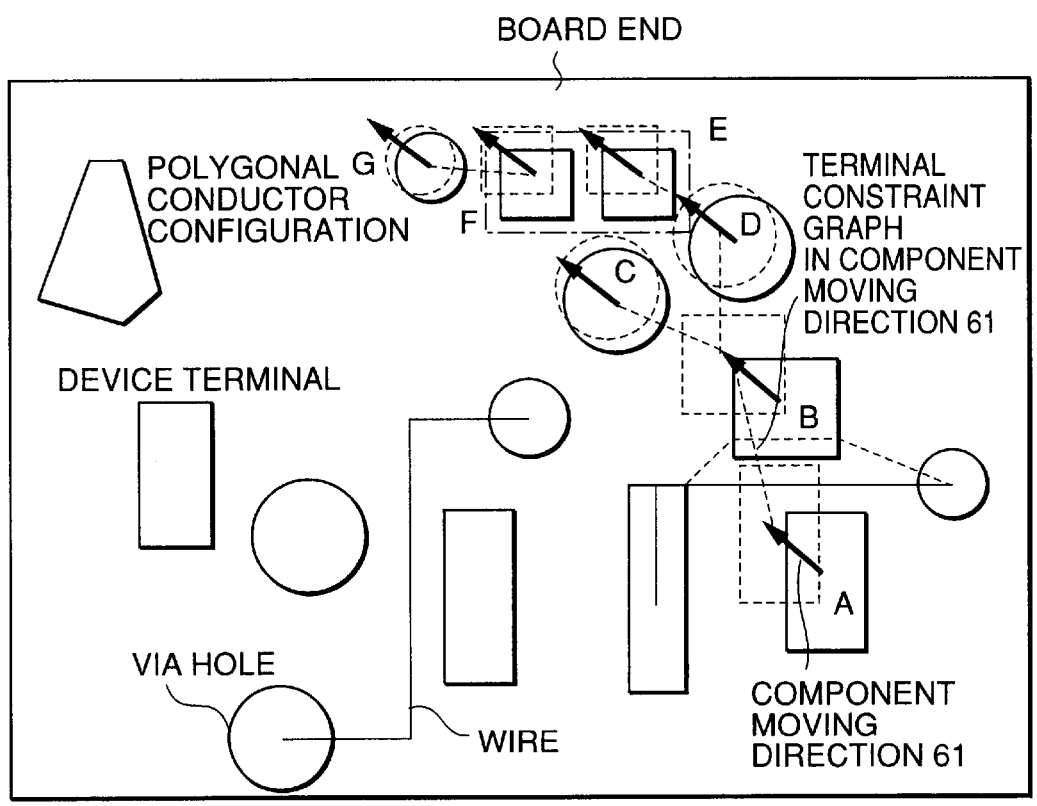
FIG. 13 is a view for describing component compaction.

More specifically, it is assumed that the movement of the device terminal A is requested as illustrated in FIG. 13. In this event, the movement of the device terminal A interferes with the device terminal B in the neighborhood through the routing zone. Therefore, the terminal constraint graph generator 104 prepares the terminal constraint graph data connecting the device terminals A and B. The moving group net graph generator 106 prepares the moving group net graph data. The component compactor 107 prepares the component moving distance data of the device terminal B and moves the device terminal B by the component moving distance. Then, the movement of the device terminal B results in interference between the device terminal B and the via hole C. Therefore, the terminal constraint graph generator 104, the moving group net graph generator 106, and the component compactor 107 prepare the terminal constraint graph data connecting the device terminal B and the via hole C, the moving group net graph data, and the component moving distance data of the via hole C, respectively. Subsequently, similar processing is carried out for a combination of the device terminal B and the via hole D and a combination of the via hole D and the component terminal E. Furthermore, since the component terminals E and F have a common moving group number 32, the movement of the device terminal E is followed by the movement of the device terminal F. Therefore, the interference is caused between the device terminal F and the via hole G so that similar processing is carried out also for the device terminal F and the via hole G.

If the movement of the device terminal G results in an interference with the board end and the position-fix indication for the board end is present, compaction is impossible. In this event, highlightened indication is provided,on the display section 101 (see FIG. 10) to inform that the compaction is impossible.

Figure 14:
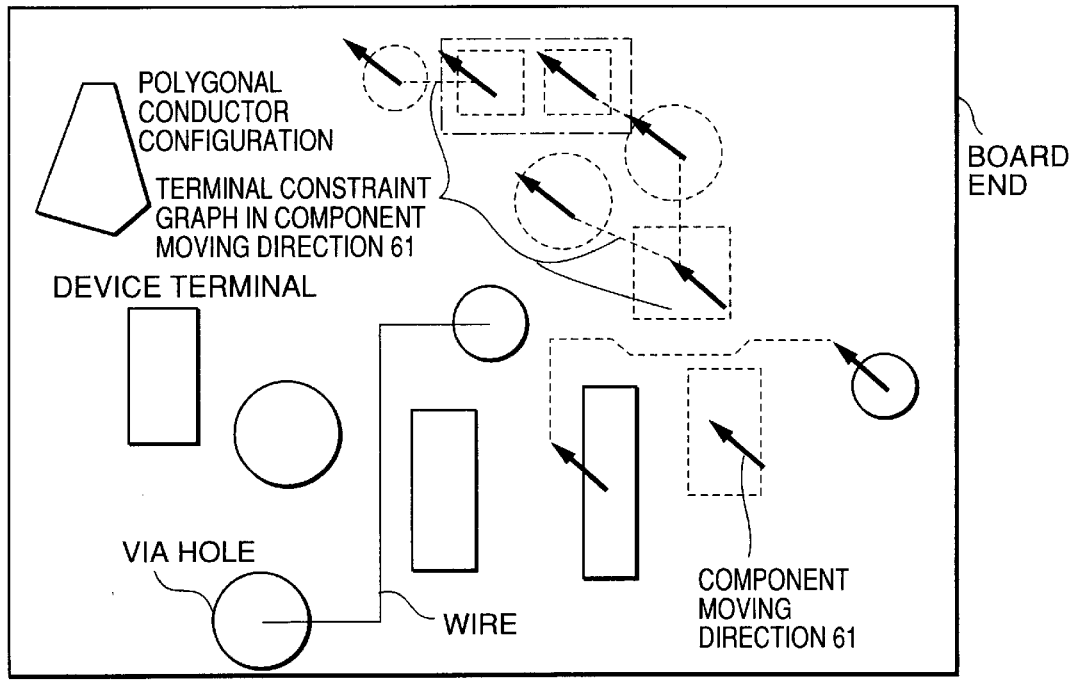
FIG. 14 is a view for describing wire compaction.

If component compaction is possible, the wire compactor 108 prepares the wire configuration in the following manner. In the order of storage in the constraint graph data and in the order from the wire located forward in the moving direction, the wire is bent in the longitudinal, the lateral, and the diagonal directions along the configuration of the component or the existing wire located forward in the moving direction 61. As illustrated in FIG. 14, the configuration data of the routing suppress region of an octagonal shape is prepared which is obtained by pushing the wire interposed between the components towards the device terminal B and winding the wire therearound. The configuration number of the configuration data is memorized.

Figure 15:
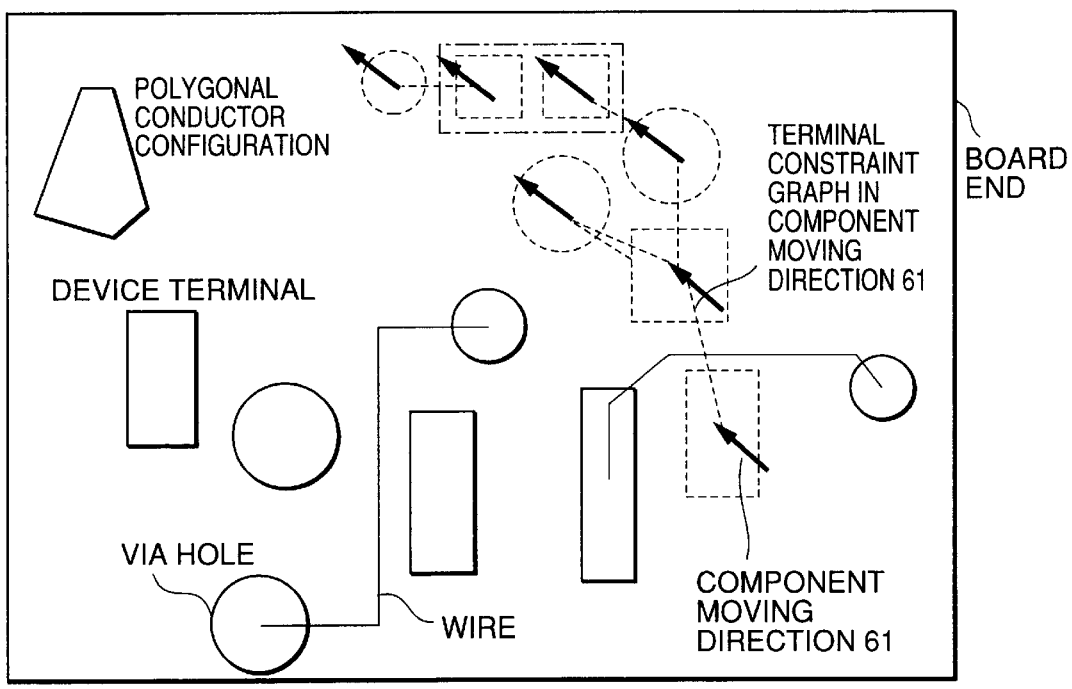
FIG. 15 is a view for describing wire rerouting.

Finally, the rerouting unit reroutes the wires between the components, as illustrated in FIG. 15.

Figure 17:
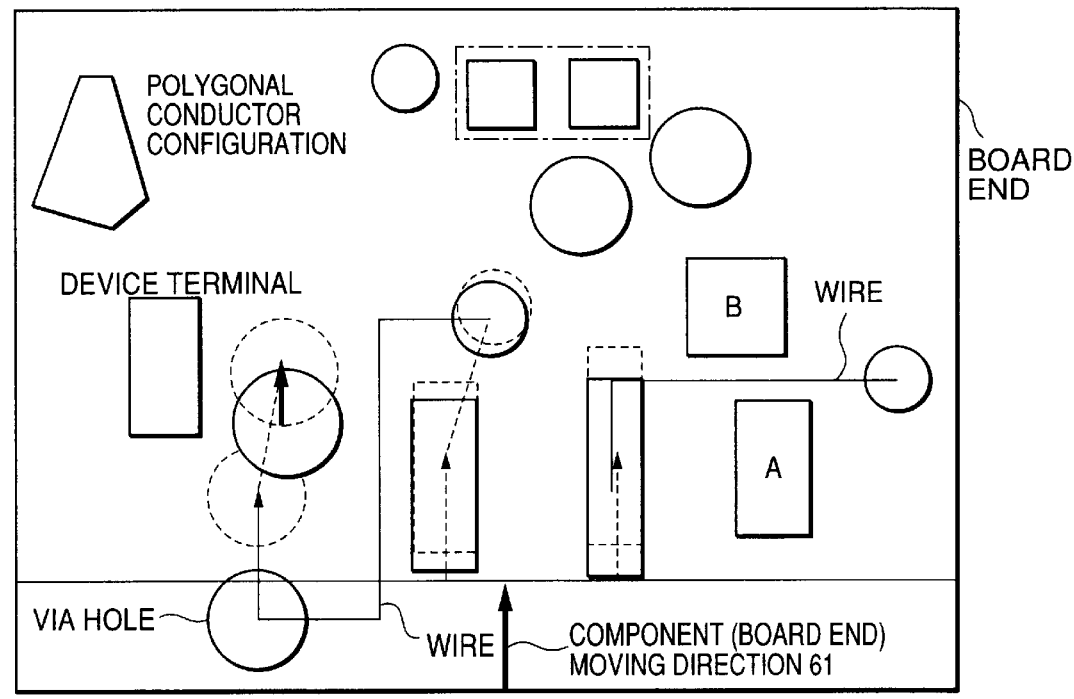
FIG. 17 is a view for describing preparation of the terminal constraint graph data.
Figure 18:
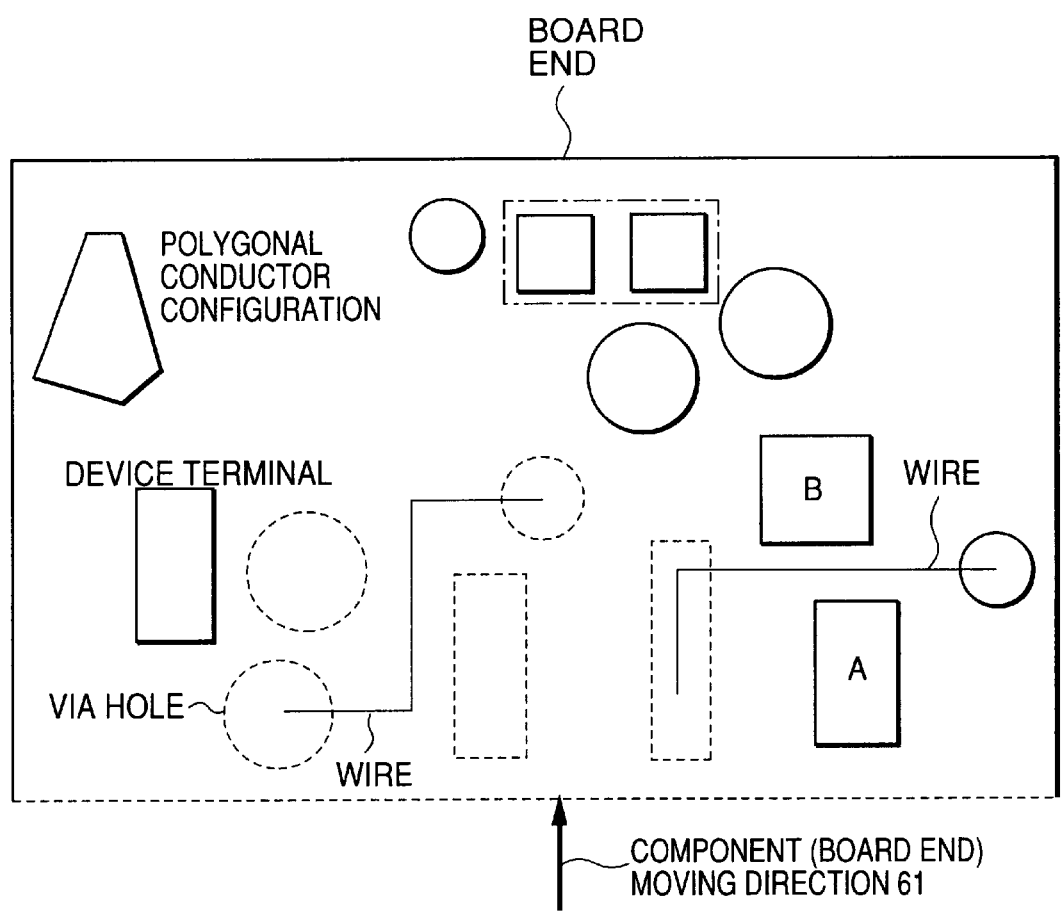
FIG. 18 is a view for describing the component compaction and the wire rerouting.

Next referring to FIGS. 16 through 18, description will be made about the case where the instruction to move the board end is supplied.

Figure 16:
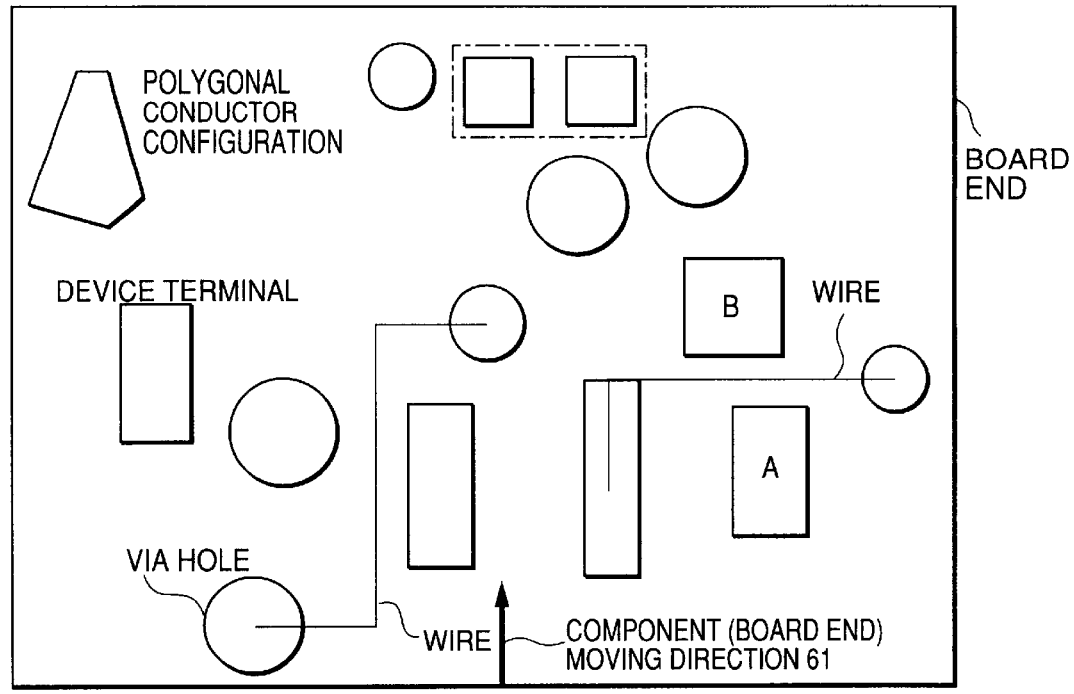
FIG. 16 shows a graphic layout for describing an operation upon reception of an instruction to move a board end.

It is assumed that the instruction to move the board end (to reduce the contour) as illustrated in FIG. 16 is supplied from the instruction input device 110. In this event, the terminal constraint graph generator 104 prepares the terminal constraint graph data for the moving direction 61 of the board end as illustrated in FIG. 17 (step S108). Next referring to FIG. 18, the component compactor 107 moves the board end and the rerouting unit 109 reroutes the wire between the components. Thus, the board contour is reduced and the components are moved in conformity with the reduced contour to compact the layout.

Next, description will be made about a second embodiment of this invention.

Figure 19:
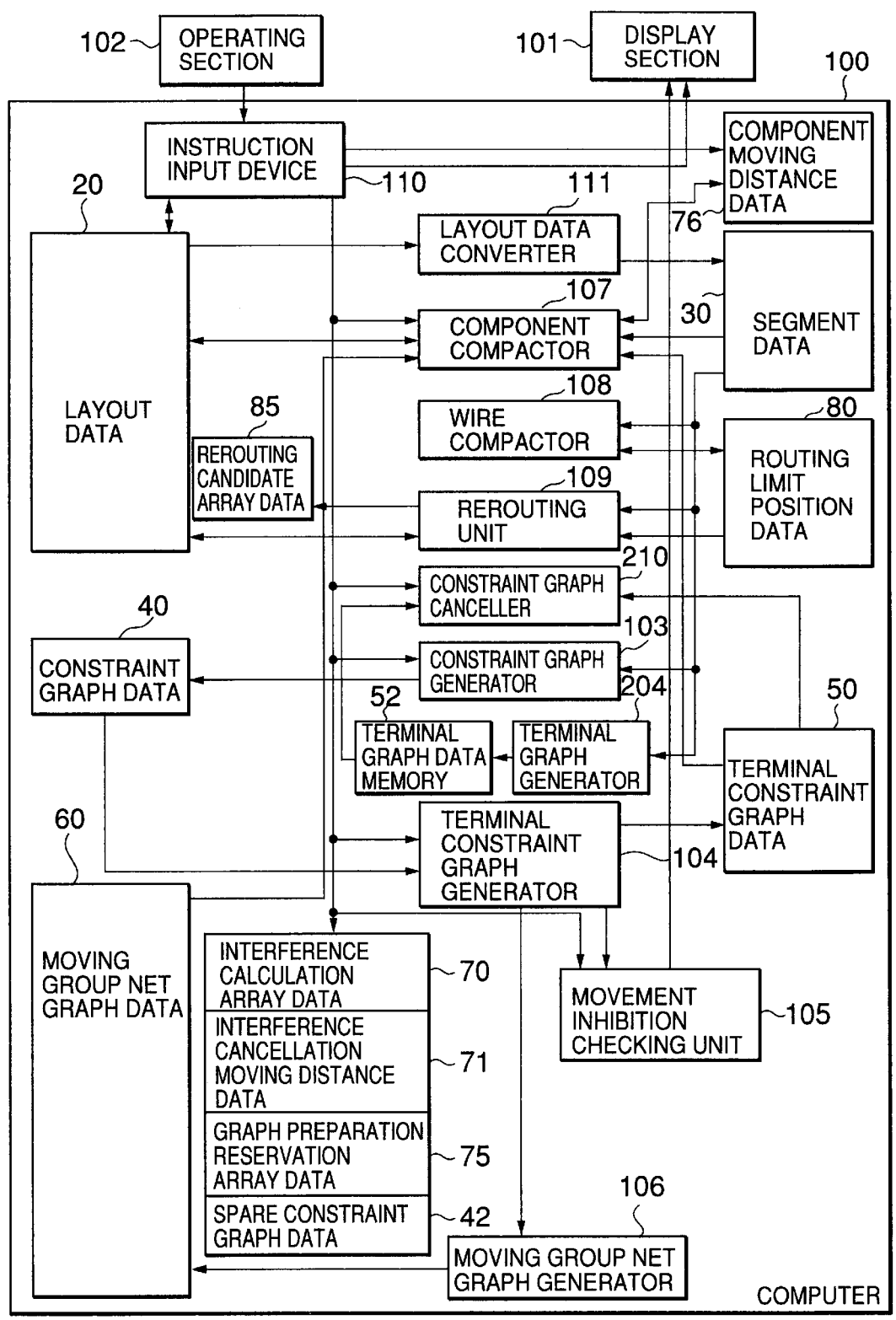
FIG. 19 is a block diagram of a graphic layout modification system according to a second embodiment of this invention.

Referring to FIG. 19, a graphic layout modification system according to the second embodiment further comprises a terminal graph generator 204 and a constraint graph canceller 210 in addition to the structure of the first embodiment.

The constraint graph generator 103 is operated in a manner slightly different from that of the first embodiment.

The operation of the above-mentioned elements will be described hereinafter.

For each of all segments, the constraint graph generator 103 prepares constraint graph data 40 which records the order of adjacent segments in each of quantizing directions of the X direction, the Y direction, the +45° diagonal direction, and the −45° diagonal direction.

For each of the quantizing directions of the X direction, the Y direction, the +45° diagonal direction, and the −45° diagonal direction and with respect to each of all components, the terminal graph generator 204 prepares terminal graph data 52 of a graph between each component terminal and another component terminal connected via a shortest distance and another terminal graph data 52 of another graph between each component terminal and still another component terminal connected via a second shortest distance. The component terminals are connected by a group of the terminal graphs.

The constraint graph canceller 210 moves a component terminal to be moved following the movement of other component terminal (first terminal), in a direction (second direction) perpendicular to the moving direction 61 of the first terminal.

Next referring to FIGS. 20 through 24, an operation of the graphic layout modification system according to the second embodiment will be described in detail.

Figure 20:
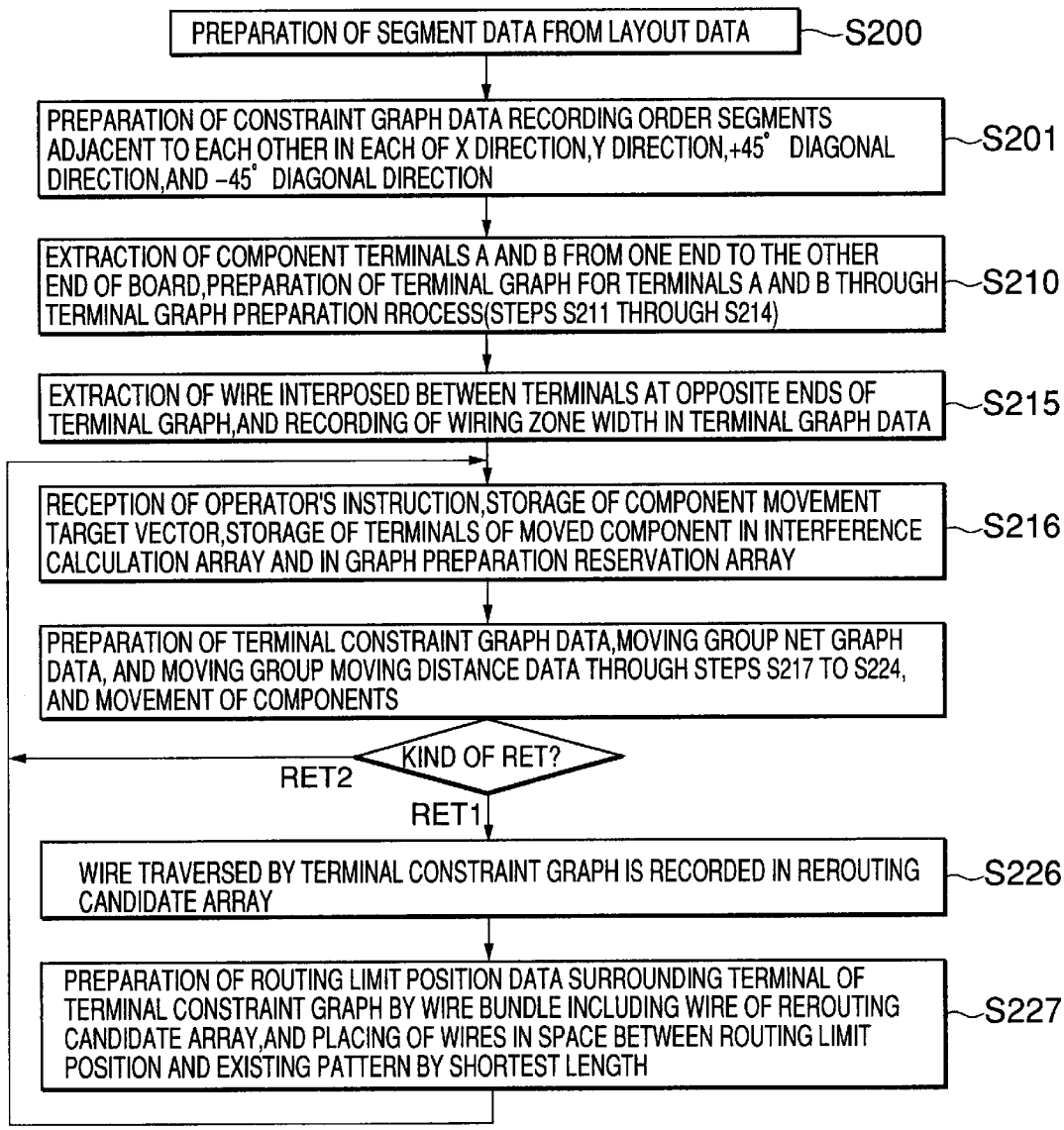
FIG. 20 is a flow chart for describing an operation of the graphic layout modification system illustrated in FIG. 19.

In a step S200 in FIG. 20, the layout data converter 111 prepares the segment data to be memorized in the segment data memory 30, in the manner similar to the step S100 in FIG. 5.

Next in a step S201, the constraint graph generator 103 determines the order of placing all segments in each of the X, the Y, the +45° diagonal, the −45° diagonal directions (hereinafter referred to as a designated direction) with reference to the coordinate values contained in the segment data. If the designated direction is the X direction, the order of placing the segments is determined with reference to the X coordinate values in the segment data. If the designated direction is the Y direction, the order is determined with reference to the Y coordinate values. The constraint graph generator 103 prepares the constraint graph data (see FIG. 8B) having the graph direction 41 as the designated direction and the segment numbers of the segments adjacent to each other in the designated direction as the segment numbers of the first and the second nodes. The constraint graph data are memorized in the constraint graph data memory 40.

Next in a step S210, the terminal graph generator 204 reads the segment data from the segment data memory 30 only with respect to the device terminals and the via holes (the component terminals) among the segments. The reading operation is carried out successively from the component terminal located at the leftmost end of the board to the component terminal located at the rightmost end. Then, the reading operation is carried out from the component terminal located at the lowermost end to the component terminal located at the uppermost end. The terminal graph generator 204 combines the segment data of the component terminals into pairs each of which comprises adjacent ones of the component terminals. Each pair is subjected to the terminal graph preparation process in steps S211 through S214 illustrated in FIG. 21, as will later be described. By this process, the terminal graph generator 204 prepares the terminal graph data including the graph direction 41, the component terminal segment number of the first node of the graph, the component terminal segment number of the second node of the graph, the width of the routing zone, the number n of the wires traversed by the graph, and the segment numbers 31 of the wires traversed by the graph, as illustrated in FIG. 22. The terminal graph data are stored in the terminal graph data memory 52. After completion of the above-mentioned process for all component terminals, the operation proceeds to a step S215.

Figure 21:
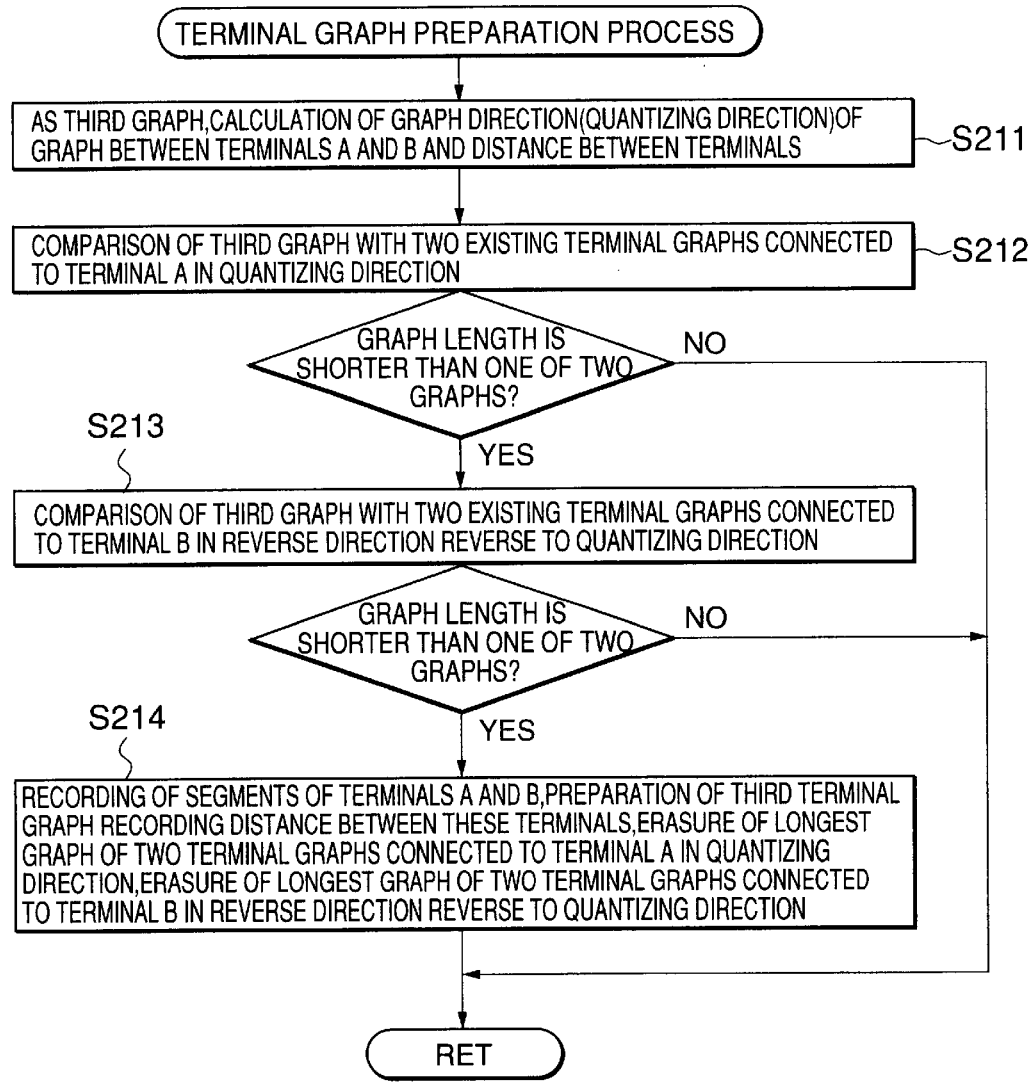
FIG. 21 is a flow chart for describing a step S210 in FIG. 20 in detail.

Now, the terminal graph preparation process will be described. Referring to FIG. 21, the terminal graph generator 204 calculates in a step S211 the quantizing direction with respect to a graph (third graph) connecting given component terminals A and B. Specifically, a direction connecting the component terminals A and B is approximated to one of the eight quantizing directions including the longitudinal, the lateral, the diagonal directions angularly offset by 45°. The distance between the component terminals is used as the graph length of the third graph.

Next in a step S212, the terminal graph generator 204 reads from the terminal graph data memory 52 two existing terminal graph data connected to the component terminal A in the quantizing direction and compares the third graph with these existing graphs.

When the length of the third graph is shorter than one of the lengths of the terminal graphs represented by the two terminal graph data, the operation proceeds to a step S213. In the step S213, the terminal graph generator 204 reads from the terminal graph data memory 52 two further existing terminal graph data connected to the component terminal B in a reverse direction reverse to the quantizeing direction for comparison with the third graph.

When the length of the third graph is shorter than one of the lengths of the terminal graphs represented by the terminal graph data, the operation proceeds to a step S214. In the step S214, the terminal graph generator 204 prepares terminal graph data having the graph direction 41 identical with the quantizing direction of the third graph and the component terminals A and B as the first and the second nodes.

The terminal graph data are memorized in the terminal graph data memory. At this stage, information of the routing zone is not contained. Among the two terminal graph data 52 connected to the component terminal A in the quantizing direction, one of the terminal graph data exhibiting a longest graph length is erased. Among the two terminal graph data connected to the component terminal B in the reverse direction reverse to the quantizing direction, one of the terminal graph data exhibiting a longest graph length is erased.

After the terminal graph preparation process described above, the operation proceeds to the step S215.

In the step S215, the terminal graph generator 204 successively reads all constraint graph data from a lower board end to an upper board end, further from a left board end to a right board end, then in the +45° diagonal direction, and in the −45° diagonal direction, and extracts the segment numbers 31 of the wires interposed between the segment numbers 31 of the component terminals at both ends of the terminal graph data in each direction. In the terminal graph data 52, the segment numbers 31 of the wires are recorded in the order of the rerouting between the both terminals. The sum of the wire widths and the necessary gaps is calculated and recorded as the routing zone width.

In a step S216, the instruction input device 110 is responsive to the instruction from the operator and prepares the movement target vector of the component (object component), in the manner similar to the first embodiment. Furthermore, the instruction input device 110 records as the graph preparation reservation array data a pair of the segment number 31 of the object component and the moving direction 61. As the component moving distance data, a set of the moving group number 32, the moving direction 61, and the moving distance 77 are recorded. The instruction input device 110 makes the display section 101 display the movement target vector, for example, by the use of an arrow as illustrated in FIG. 4.

Thereafter, the operation proceeds to a step S217.

Figure 23:
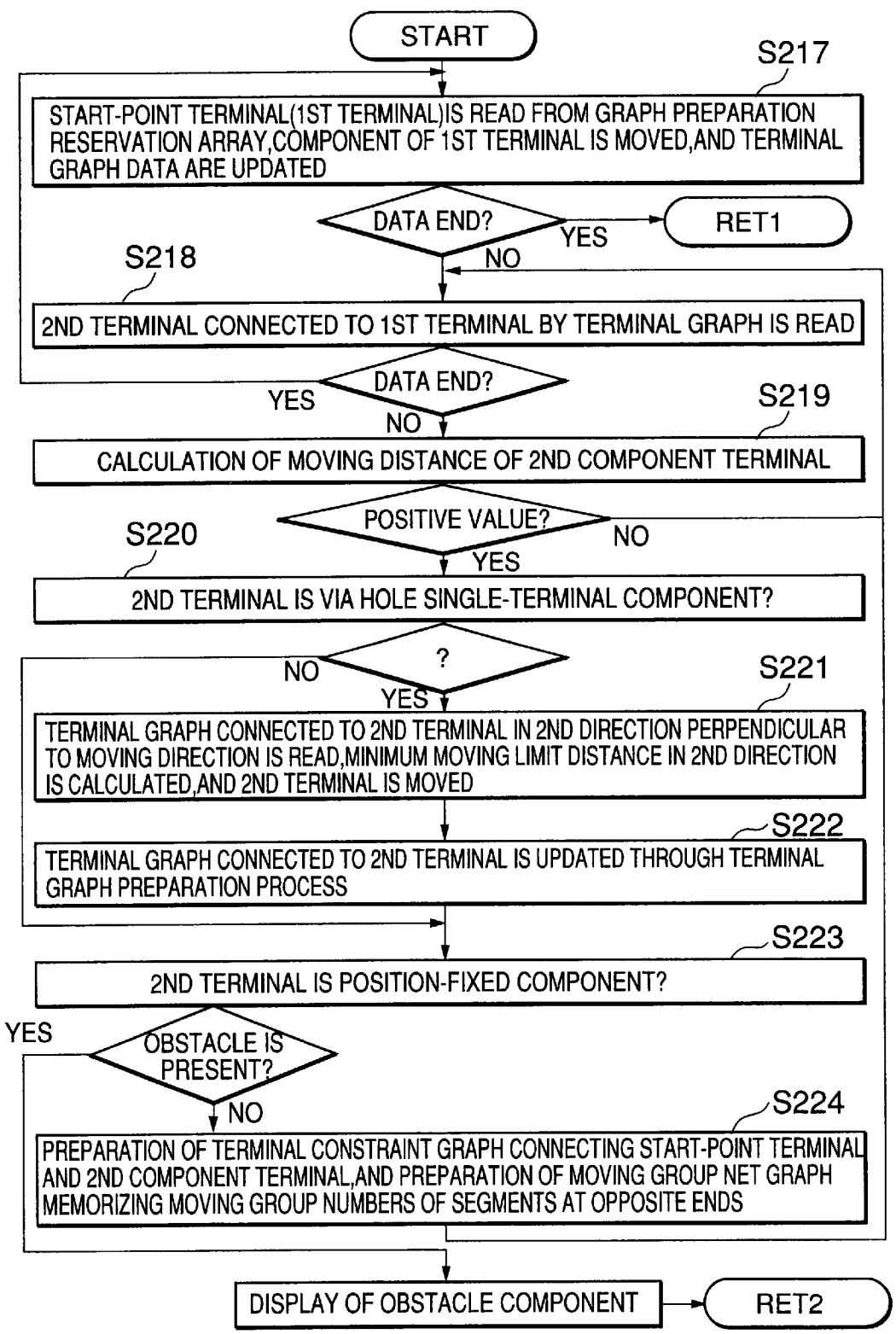
FIG. 23 is a flow chart for describing steps S217 to S224 in FIG. 20 in detail.

The steps S217 through S224 will be described with reference to FIG. 23.

At first in the step S217, the component compactor 107 reads the graph preparation reservation data, reads the segment number 31 of the component terminal (first terminal) at the movement start point and the moving direction 61, reads the moving distance 77 from the component moving distance data 76 of the moving group number 32 of the segment data 30, and moves the component of the first terminal.

The terminal graph generator 204 prepares the terminal graph data through the above-mentioned terminal graph preparation process (steps S211 to S214). Specifically, the first terminal is used as the terminal A while a component terminal connected to the terminal A via the existing terminal graph data is the terminal B. For the existing terminal graph data, the graph direction 41 is updated. Herein, the wire segment number 31 included in the terminal graph data newly prepared is obtained by searching the route of a plurality of existing terminal graph data connecting the terminals A and B and by extracting the wire segment numbers 31 contained in the terminal graph data on that route. In case where one of the position numbers 33 of the wire segment data is shared by successively adjacent wire segment (adjacent segment) alone, the segment number 31 of the adjacent segment is removed. The remaining wire segment number 31 is used as the wire segment number 31 interposed between the both terminals of the terminal constraint graph of the terminals A and B and is included in the new terminal graph data. The terminal graph generator 204 calculates the routing zone width to be included in the new terminal graph data 52.

After completion of the processing of all graph preparation reservation array data, the operation proceeds to a step S226.

In a step S218, the component compactor 107 extracts terminal graph data connected to the first terminal in the component moving direction 61 to acquire a component terminal (second terminal) connected via the terminal graph data. The second terminal is subjected to the operation in a step S219. After completion of processing of all of the second terminals for the given first terminal, the operation returns to the step S217.

In a step S219, the terminal constraint graph generator 104 calculates the moving group relative movement limit length M within which the component is movable in the moving direction 61 with the routing zone interposed between the first and the second terminals, in the manner similar to the step S106 in FIG. 5. Then, the terminal constraint graph generator 104 calculates a difference obtained by subtracting the moving group relative movement limit length M from the moving distance 77 of the first terminal. If the difference has a positive value, the operation proceeds to a step S220. Otherwise, the operation returns to the step S218.

In the step S220, judgment is made about whether or not the second terminal is a via hole or a device terminal of a single terminal device. If so, the operation proceeds to a step S221. Otherwise, the operation jumps to a step S223.

In the step S221, the constraint graph canceller 210 reads a plurality of terminal graph data connected to each terminal of the device related to the second terminal in a direction (second direction) perpendicular to the moving direction 61 of the first terminal. In the manner similar to the step S106 in FIG. 5, calculation is made of the moving group relative movement limit length M of the terminal constraint graph data of the terminals at both ends of the terminal graph data in the second direction. Calculation is made of the moving group relative movement limit length M of the moving group net graph data. Among the moving group relative movement limit length M, a minimum value (minimum limit movement distance) is obtained. The component of the second terminal is moved in the second direction by the minimum movement limit distance.

Then in a step S222, the terminal graph generator 204 prepares new terminal graph data through the terminal graph preparation process (steps S211 to S214). Specifically, the second terminal is used as the terminal A while a component terminal connected to the terminal A via the existing terminal graph data is used as the terminal B. For the existing terminal graph data, the graph direction 41 is updated. Herein, the wire segment numbers 31 included in the terminal graph data newly prepared is obtained by searching the route of a plurality of existing terminal graph data connecting the terminals A and B and by extracting the wire segment numbers 31 contained in the terminal graph data on that route. In case where one of the position numbers 33 of the wire segment data is shared by successively adjacent wire segment (adjacent segment) alone, the segment number 31 of the adjacent segment is removed. The remaining wire segment number 31 is used as the wire segment number 31 interposed between the both terminals of the terminal constraint graph of the terminals A and B and is included in the new terminal graph data. The routing zone width is calculated and included in the new terminal graph data 52.

If the terminal graph data 52 connecting the first terminal in its moving direction 61 to the second terminal still exist after the above-mentioned process, the moving group relative movement limit length M is calculated again. A difference is obtained by subtracting the moving group relative movement limit length 51 from the moving distance 77 of the first terminal. If the difference has a positive value, the operation proceeds to the step S223. Otherwise, the operation returns to the step S218.

In the step S223, the movement inhibition checking unit 105 confirms presence or absence of the position-fix indication for the neighbor component to which the second terminal belongs, in the manner similar to the step S107 in FIG. 5. In presence of the position-fix indication for the neighbor component, the moving group net graph data are traced reversely from the neighbor component to the component at the movement start point. The segment number 31 is read from the terminal constraint graph data contained in the moving group net graph data. The terminal is displayed on the display section 101 in a highlightened mode to inform the operator of a defective portion. After restoring all of the data modified following the movement of the component at the movement start point into the original state before modification, the operation returns to the step S216. In absence of the position-fix indication for the neighbor components, the operation proceeds to a step S224.

In the step S224, the terminal constraint graph generator 104 prepares terminal constraint graph data having the first and the second terminals at both ends, in the manner similar to the step S108 in FIG. 5. The terminal constraint graph data include as the nodes of the graph the segment numbers 31 of the terminals at both ends, the wire segment numbers 31 therebetween in sequence, the width of the routing zone, and the moving group relative movement limit length. The moving group net graph generator 106 prepares moving group net graph data including as nodes the moving group numbers 32 of the terminals at both ends of the terminal constraint graph data, the moving group relative movement limit length 51, and the terminal constraint graph name.

The component compactor 107 calculates a difference obtained by subtracting the moving group relative movement limit length 51 from the component moving distance 77 of the component moving distance data of the moving group number 32 of the first terminal. The difference is compared with the component moving distance 77 contained in the component moving distance data of the second terminal. If the difference is greater than the component moving distance contained in the component moving distance data of the second terminal, the component moving distance 77 of the component moving distance data of the first terminal is updated. After the segment number 31 of the terminal having the moving group number 32 common to the second terminal and the moving direction 61 are included in the graph preparation reservation array data, the operation returns to the step S218.

Figures 24, 25:
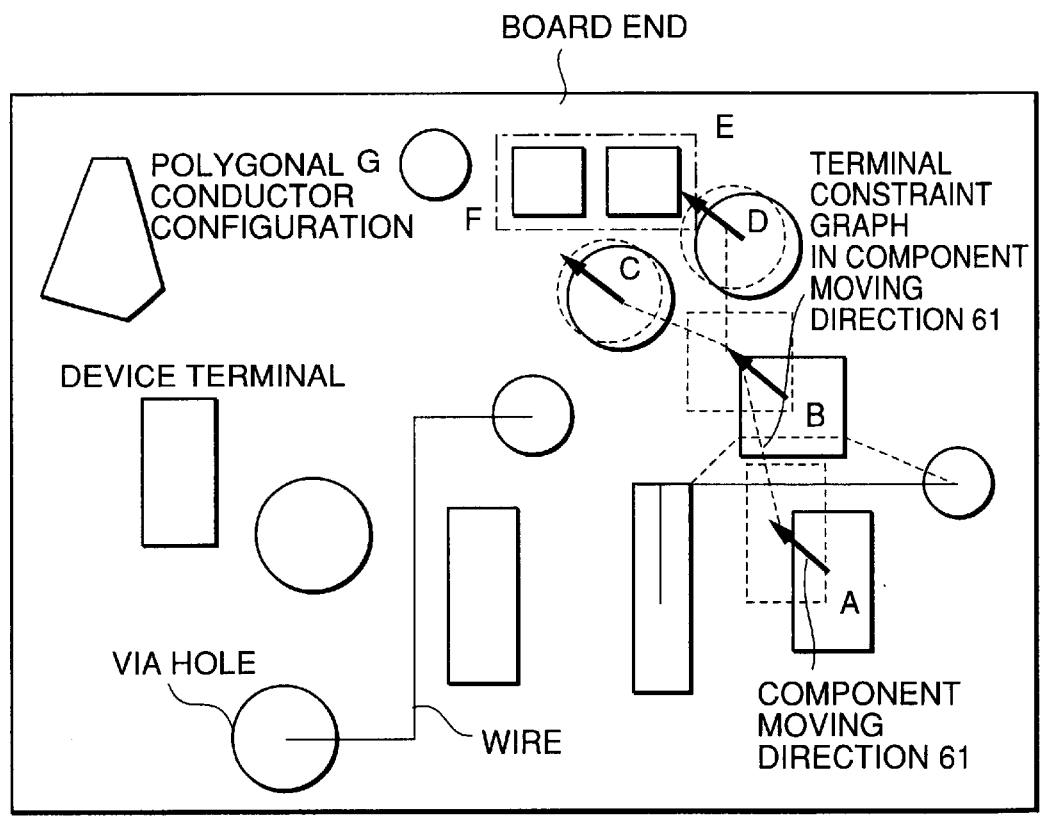
FIG. 24 shows a data structure of rerouting candidate array data.
FIG. 25 is a view for describing component compaction in the second embodiment.

In a step S226, the rerouting unit 109 makes the rerouting candidate array data memory 85 memorize as rerouting candidate array data the wire segment numbers 31 contained in the terminal constraint graph data. The data structure of the rerouting candidate array data is illustrated in FIG. 24.

In a step S227, the rerouting unit 109 selects the wire (processed wire) from the rerouting candidate array data and extracts from the terminal constraint graph data memory 50 the terminal constraint graph data containing the wire segment number 31 of the selected wire.

For each of the both device terminals of the extracted terminal constraint graph data, the wire compactor 108 calculates on the side of the device terminal the routing zone width including other wires present therebetween. The configuration data of the routing suppress region of an octagonal shape are obtained by adding the routing zone width to the eight sides in the longitudinal, the lateral, and the diagonal directions. If the wire already determined in position is present therebetween, the wire is recognized as a fixed configuration. Around this fixed configuration, a deformable wire bundle is freely bent to prepare the configuration data of the routing suppress region of an octagonal shape surrounding the fixed configuration. The wire compactor 108 prepares routing limit position data (see FIG. 12) including the configuration number 36 of the configuration data, the processed wire segment number 31, the direction 81 from the processed wire towards the device terminal in the routing suppress region, the segment number 31 of the component terminal, and the position number 33 of the component terminal. The routing limit position data are memorized in the routing limit position data memory.

After the wire compactor 108 prepares the routing limit position data for all of the terminal constraint graph data recording the processed segment, the rerouting unit 109 reroutes the processed wire outside of the routing suppress region of the routing limit position data.

The above-mentioned operation (step S227) is repeated until all of the rerouting candidate array data are processed. Upon completion, the operation returns to the step S216 to wait a next instruction of the operator.

In the above-mentioned manner, the layout is compacted by the graphic layout modification system according to the second embodiment.

According to this embodiment, the compaction is carried out in the following manner for example.

Figure 26:
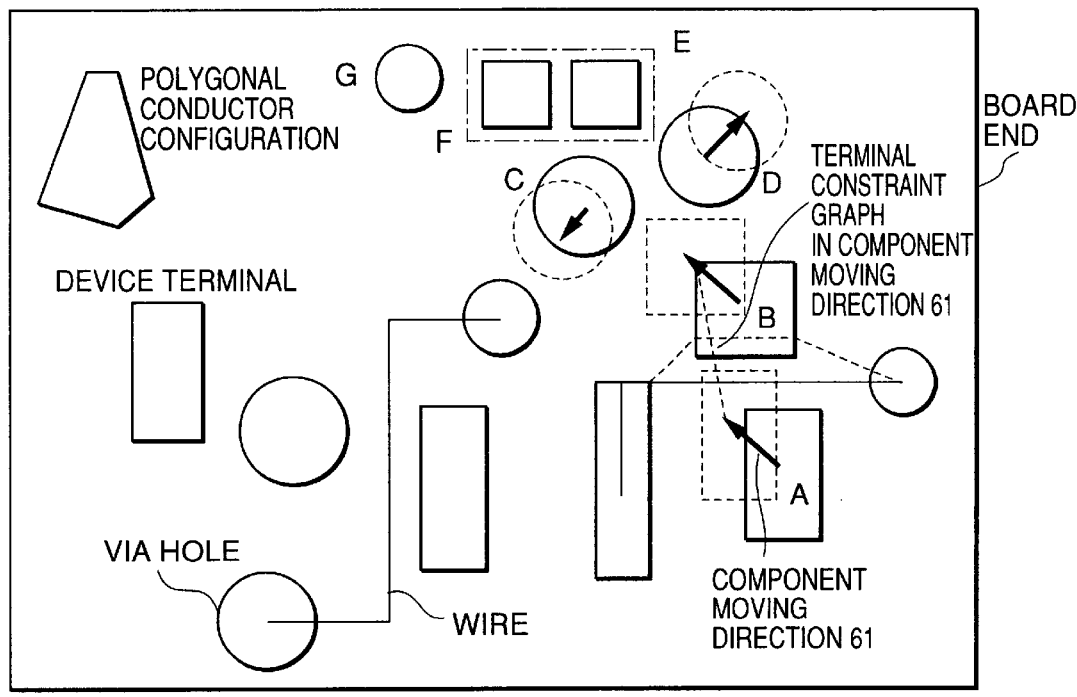
FIG. 26 is a view for describing the component compaction in the second embodiment.

As illustrated in FIG. 25, the movement of the device terminal A results in an interference with the neighbor component terminal B with the routing zone interposed therebetween. Therefore, the terminal constraint graph generator 50 prepares the terminal constraint graph data 50 connecting the device terminals A and B. The component compactor moves the device terminal B by the distance to cancel the interference with the device terminal A, i.e., the distance obtained by subtracting the moving group relative movement limit length 51 of the device terminal B from the moving distance 77 of the device terminal A. In this event, the device terminal B interferes with the components C and D. Next, the constraint graph canceller 210 moves the components C and D in a direction perpendicular to the moving direction 61 of the terminal A, as illustrated in FIG. 26 (step S221). Then, the components C and D no longer interferes with the device terminal B. Therefore, preparation of the terminal constraint graph data 50 is finished.

Figure 27:
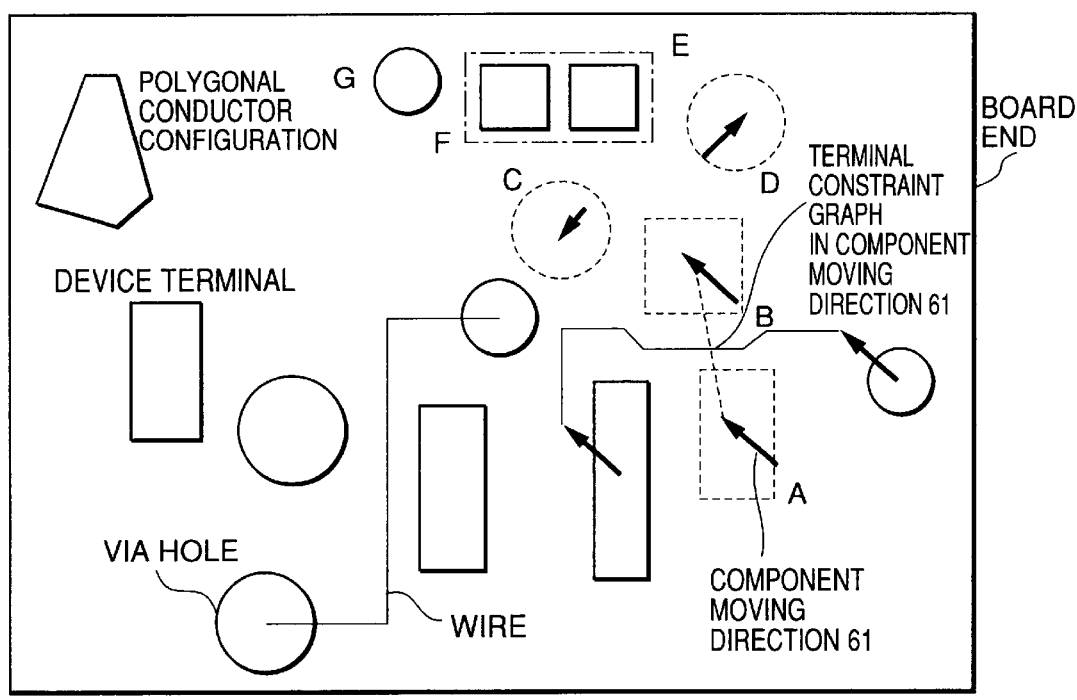
FIG. 27 is a view for describing wire compaction in the second embodiment.
Figure 28:
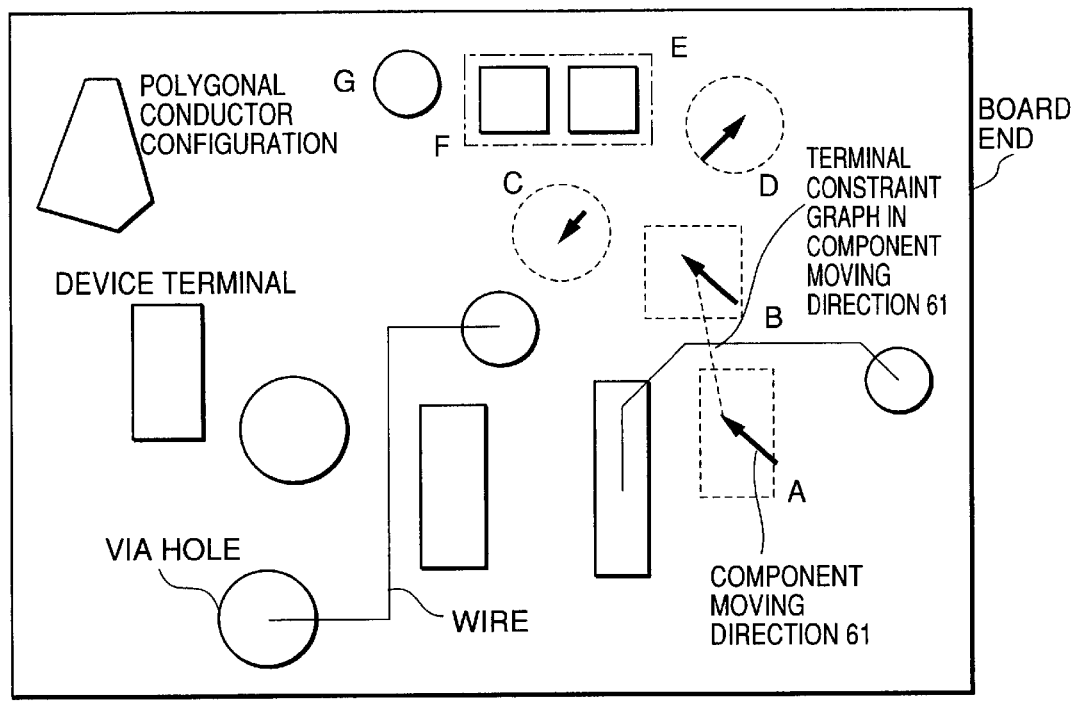
FIG. 28 is a view for describing wire rerouting in the second embodiment.
Figure 29:
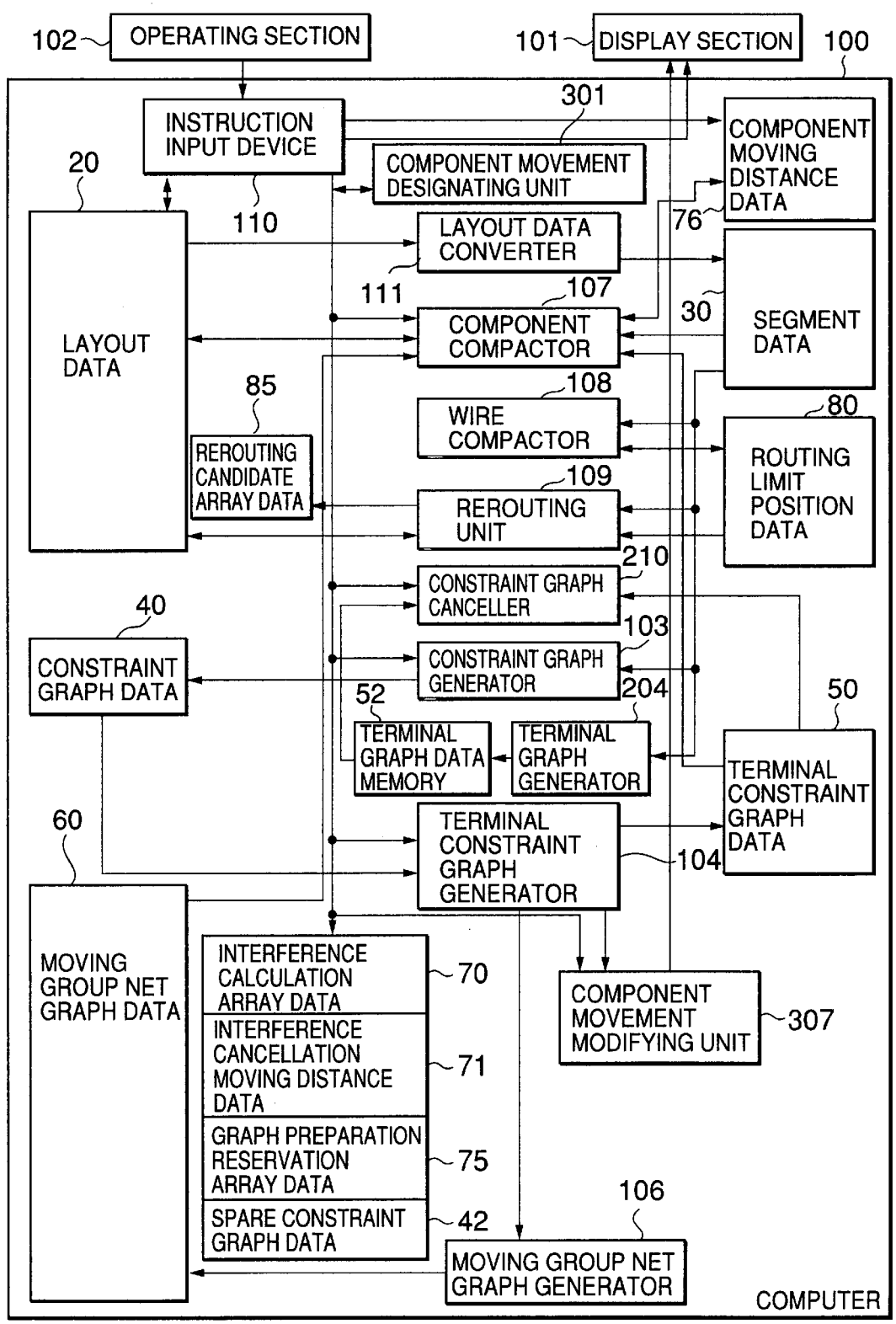
FIG. 29 is a block diagram of a graphic layout modification system according to a third embodiment of this invention.

Next referring to FIG. 27, the wire compactor 108 prepares the configuration data 35 of the routing suppress region of an octagonal shape formed by pushing the wires interposed between the component terminals towards the device terminal B and winding the wires therearound. The routing limit position data 80 recording the configuration number 36 of the configuration data 35 are prepared. The rerouting unit 109 reroutes the wires outside of the routing suppress region, as illustrated in FIG. 28.

In the second embodiment described above, the via hole as an obstacle against the movement in the component moving direction 61 is moved in a direction perpendicular to the component moving direction 61 to cancel the interference. Thus, the interference in the component movement is automatically cancelled to enable the movement of the component.

Specifically, every time when the terminal constraint graph data 50 are prepared, the via hole as an obstacle after the movement of the component is detected. In order to move the via hole in the direction (second direction) perpendicular to the component moving direction 61, the minimum movement limit distance in the second direction is calculated and movement by the calculated distance is performed.

Now, description will be made about a third embodiment of this invention.

Referring to FIG. 27, a graphic layout modification system according to the third embodiment is basically similar in structure to the second embodiment except that the system further comprises a component movement designating unit 301 and that the movement inhibition checking unit 105 is replaced by component movement modifying unit 307.

The component movement designating unit 301 is for setting a movement target vector designating the moving direction 61 of each component toward a desired position in the layout.

The component movement modifying unit 307 is for modifying, when the chain reaction of the component movement reaches the component designated as a position-fix component, the moving distance of each component so that the component movement does not conflict with the position-fix component.

Figure 30:
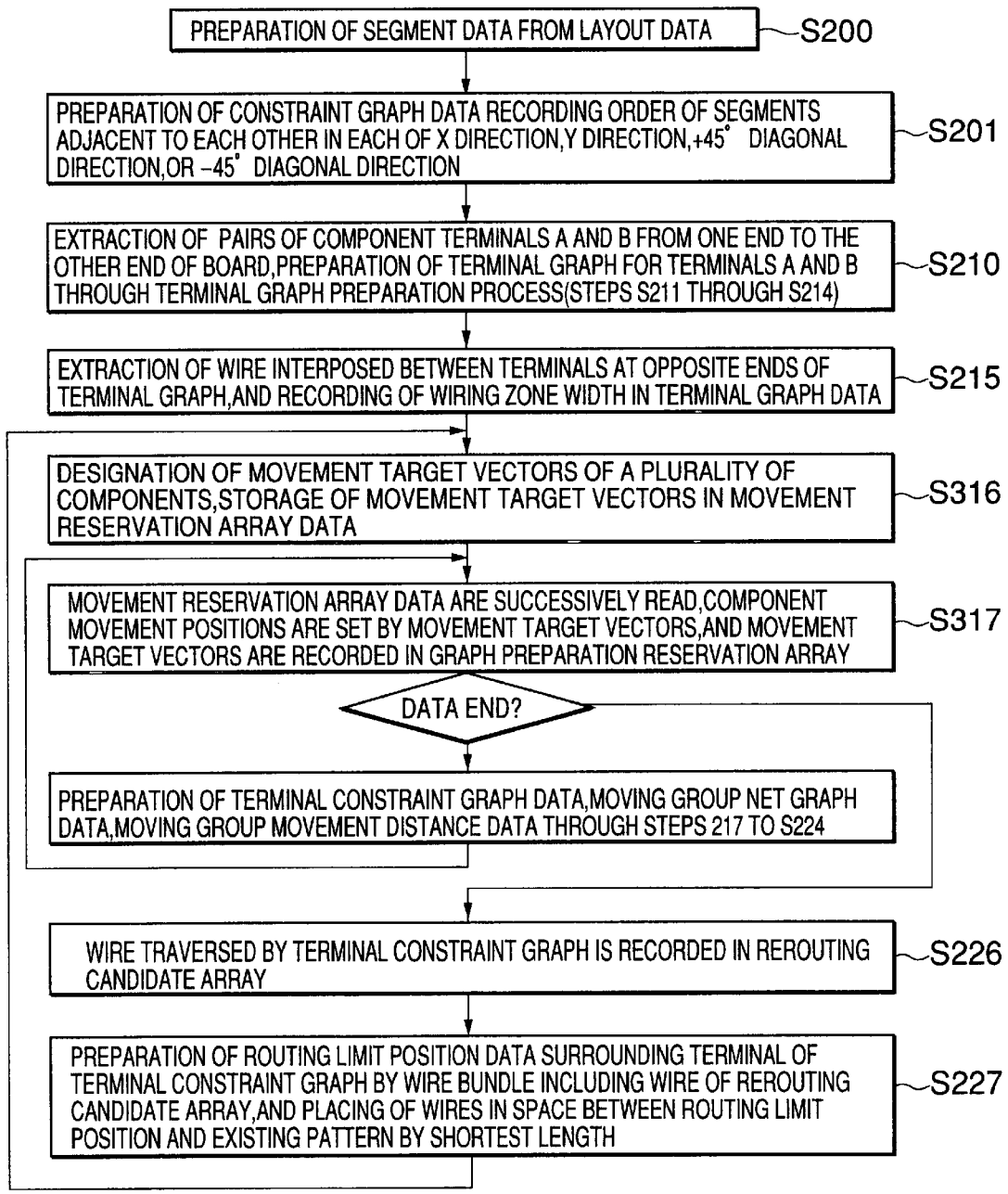
FIG. 30 is a flow chart for describing an operation of the graphic layout modification system in FIG. 29.
Figure 31:
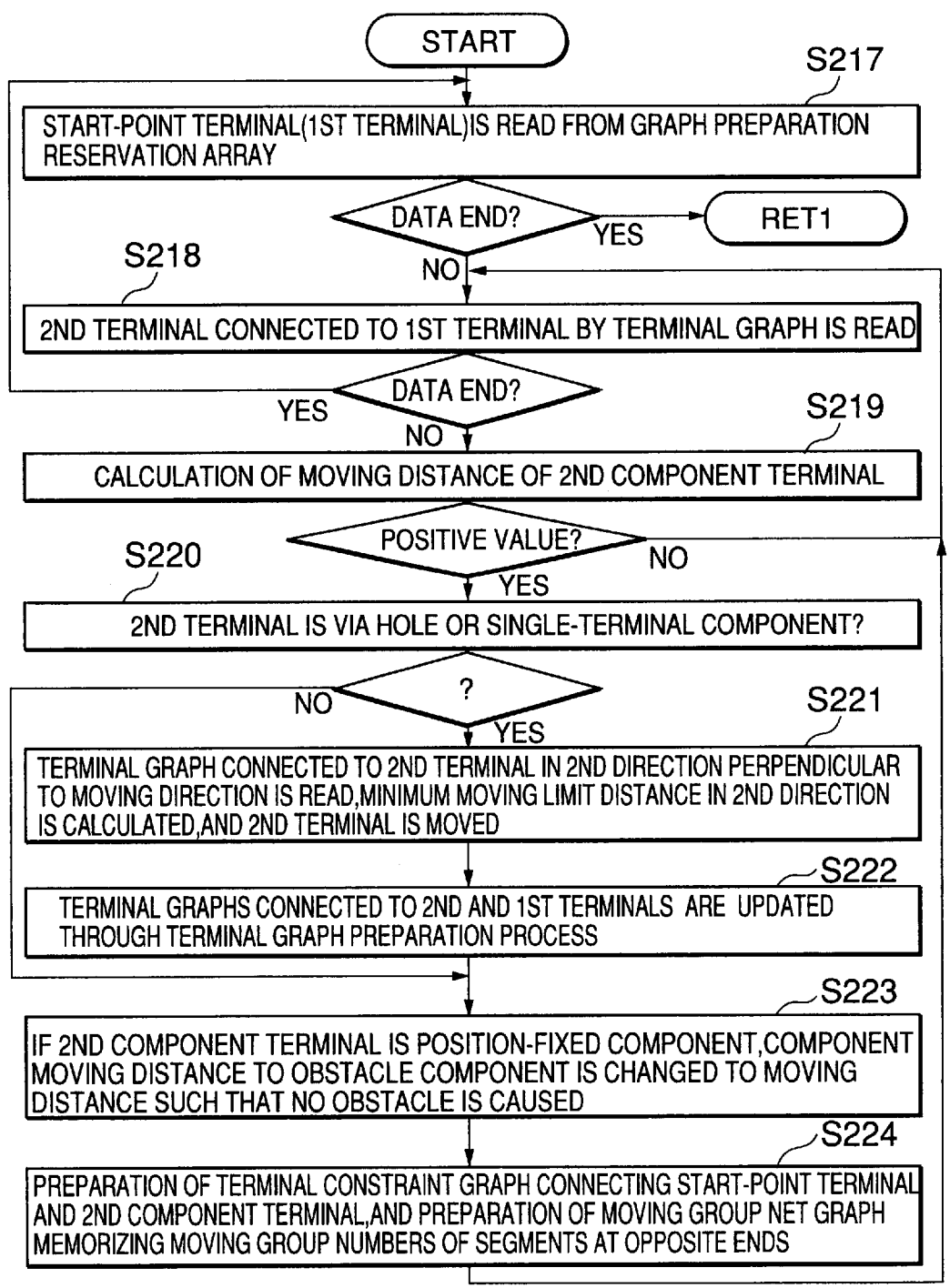
FIG. 31 is a flow chart for describing steps S217 to S224 in FIG. 30 in detail.

Referring to FIGS. 30 and 31 in addition, the operation of the graphic layout modification system according to the third embodiment will be described. In the figures, similar steps similar to those illustrated in FIGS. 20, 21, and 23 are designated by same step numbers.

At first in a step S200, the layout data converter 111 reads the layout data and prepares the segment data.

In a step S201, the constraint graph generator 103 prepares the constraint graph data.

In steps S210 and S215, the terminal graph generator 204 prepares the terminal graph data.

Then, in a step S316, the component movement designating unit 301 sets the movement target vector directed to a desired position in the layout as a movement target position of each component.

The movement target vector is set in the following manner. At first, the instruction input device 110 is responsive to the operator's instruction from the operating section 102 and makes the display section 101 display the movement target vector of each individual component. Alternatively, the movement target vectors of a plurality of components are prepared as list data and loaded in the component movement designating unit.

At this time, designation of a new wire, a new via hole, or a new component is carried out if such new element is inserted into the layout. In this event, the component movement designating unit sets the movement target vectors in two directions perpendicular to the running direction of the inserted wire so as to reserve an area around the position of the segment of the wire to cover the width of the segment and the necessary gaps. In case where the via hole or the device terminal is inserted, the movement target vectors are set in four directions in the X and the Y directions from the via hole or the device terminal.

Alternatively, it is possible to collectively set the movement target vectors of all components in the manner such that the moving directions 61 of all components are directed to a desired layout position to converge the component layout or in the manner such that the moving directions 61 are directed reversely to enlarge the component layout.

As described above, the component movement designating unit 301 prepares, with respect to the component with the movement target vector designated, graph preparation reservation array data including the segment number 31 of each component and the movement target direction. The graph preparation reservation array data are memorized in the graph preparation reservation array data memory 75. In addition, the moving group number 32, the moving direction 61, and the moving distance are recorded as the component movement distance data in the component movement distance data memory 76 (step S316).

Next, in a step S317, the terminal constraint graph generator 104 successively reads the graph preparation reservation array data from the graph preparation reservation array data memory 75, extracts the segment number 31 and the moving direction 61 of the object component, and reads the moving distance of the object component from the component movement distance data of the moving group number 32. Then, the following operation is automatically carried out. After completion of processing of all graph preparation reservation array data, the operation proceeds to a step S226.

In a step S217, the terminal constraint graph generator 104 reads the first terminal from the graph preparation reservation array data, moves the component to which the first terminal belongs, and updates the terminal graph data.

In a step S218, the terminal constraint graph generator 104 extracts the second terminal located forward in the movement. After all of the second terminals are extracted, the operation returns to the step S317.

Furthermore, the terminal constraint graph generator 104 calculates the moving distance of the component terminal of the second terminal through the steps S219 through S222.

Next in a step S323, the component movement modifying unit 307 confirms presence or absence of position-fix indication for the second terminal. In presence of the position-fix indication for the second terminal, the moving distance of the first terminal is changed to the moving limit distance beyond which the second terminal can not be moved. The moving group net graph data are traced back to the component at the start point of the movement. The moving distance 77 of the component is changed to a limit distance such that the component located forward in the movement is not moved beyond its moving limit distance. The moving distance of the component at the start point of the movement is changed and the terminal graph data are updated.

In a step S224, the terminal constraint graph generator 104 prepares the terminal constraint graph data. The moving group net graph generator 106 prepares the moving group net graph data. The component compactor 107 prepares the component moving distance data and the graph preparation reservation array data. Then, the operation returns to the step S218.

In a step S226, the wire compactor 108 records the rerouting candidate array data 85.

Next in a step S227, the rerouting unit 109 carries out rerouting of the wires. Then, the operation returns to the step S316 to wait a new instruction from the operator.

In the manner described above, compaction of the graphic layout can be carried out by the graphic layout modification system according to this embodiment.

Figure 32:
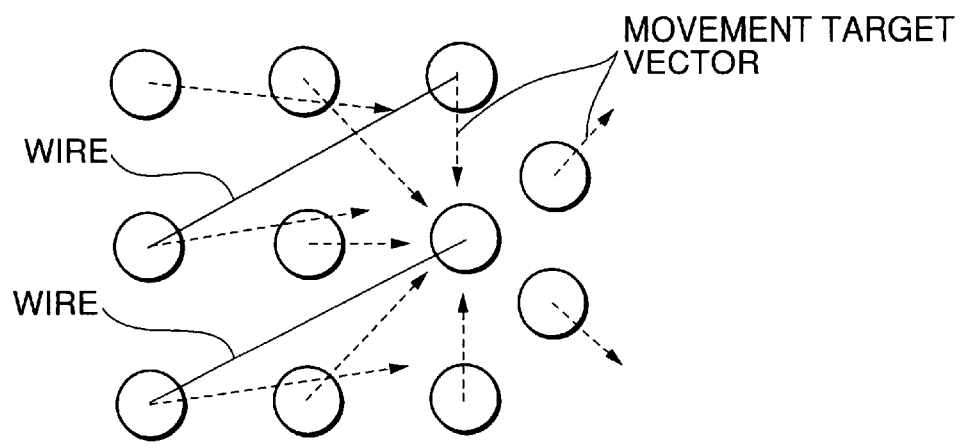
FIG. 32 is a view for describing setting of a movement target vector in the third embodiment.

For example, the layout illustrated in FIG. 32 is compacted by the graphic layout modification system in the following manner.

As illustrated in FIG. 32, the component movement designating unit 301 is responsive to the operator's instruction and prepares the graph preparation reservation array data and the component movement data designating the movement target vector of each individual component (step S316).

Figure 33:
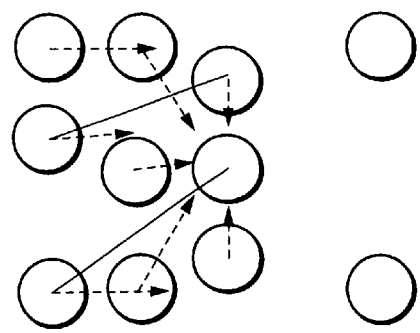
FIG. 33 is a view for describing component compaction in the third embodiment.

Next, as illustrated in FIG. 33, the component compactor 107 carries out component compaction through the steps S317 and S217 to S224. Specifically, the components are successively moved in the quantizing direction of the X or the Y direction directed to the target position of the movement target vector, in the order of the components in the graph preparation reservation array data in the X or the Y direction for each component. Although the routing image is shown in FIG. 33, specific positions of the wires are not yet determined at this stage.

Figure 34:
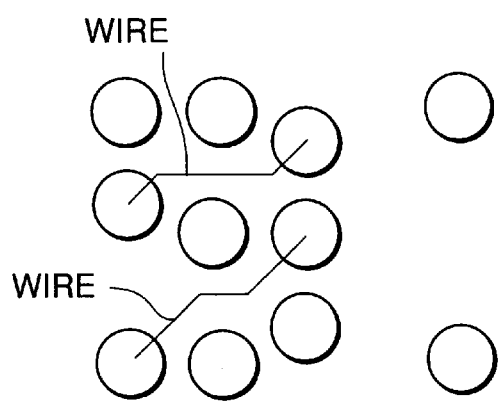
FIG. 34 is a view for describing wire rerouting in the third embodiment.

Finally, the rerouting unit 109 reroutes the wires outside of the routing suppress region in the routing limit position data 80, as illustrated in FIG. 34.

In this manner, according to this embodiment, it is possible to carry out the compaction in which the components can be moved to desired positions. For example, the layout can be even enlarged.

This is because, according to this embodiment, the component movement designating unit 301 designates the moving directions 61 of a plurality of components by the movement targets and prepares the graph preparation reservation array data memorizing the movement target vectors. Furthermore, the component movement modifying unit modifies the moving distance 77 when the component is moved towards the movement target and conflicts with the fixed component as an obstacle.

In this embodiment, it is possible to carry out compaction which will presently be described.

For example, the component movement designating unit 301 of the third embodiment sets the movement target vectors designating the movement of all components to such positions that the distances between initial positions of all components and the center of the layout are analogously enlarged.

Then, the components are moved to the positions to enlarge the layout. The rerouting unit 109 determines the routing of the wires between the components.

Thus, in the compaction of this embodiment, it is possible to place the components at the positions where the order of the components in the longitudinal and the lateral directions in the terminal constraint graph data is maintained.

Then, in the resultant layout, the additional wires between the terminals of the components are automatically placed by an automatic routing device. The wire routing is changed and modified. The components are changed in relative position.

Then, the component movement designating unit 301 designates the movement target vectors designating final component positions such that the current positions of all components are compacted to analogous positions from the center of the layout. Then, all the components are moved to the final positions towards the center of the layout so that the layout is compacted. The rerouting unit 109 determines the wire routing between the components.

In the above-mentioned manner, the routing between the components or the design modification can be carried out in a sufficiently wide space before the components and the wires are compacted. Therefore, high-density routing can easily be achieved.

This is because the system of this embodiment has the component movement designating unit 301 for designating the component movement to widen and compact the layout of all the components.

A primary advantage is as follows. When the operator supplies an instruction to move the component in a diagonal direction, the component, the neighbor component, and the wires are moved in the diagonal direction as the chain reaction. Therefore, the component layout after routing can easily be changed.

This is because the devices and the via holes are decomposed into segments per layer plane and per terminal and the segment data are recorded. Another terminal influenced by a chain reaction of the movement of the terminal in the moving direction 61 in the diagonal direction are memorized in the terminal constraint graph data 50. All component terminals of the same via hole or device are assigned with the same moving group number 32. All segments on that route are moved in the diagonal direction together with the device designated to move.

What is claimed is:

1. A graphic layout modification system for modifying a layout pattern of at least one layer with a plurality of components placed in a two-dimensional space by moving and replacing the components in each layout pattern, said system comprising:

layout data converting means supplied with layout data representative of the placement of said components for decomposing each component into segments per layer plane to prepare segment data in which those segments belonging to a single common device are assigned with a common moving group number;

movement designating means for designating the movement of at least one of said components as a movement-designated component by entering a diagonal movement target direction and an initial moving distance;

means for calculating, in order to move said components in said movement target direction, a moving group relative movement limit length within which a first component is movable towards a second component which is adjacent to said first component in the diagonal movement target direction with a wire interposed therebetween, for subtracting said moving group relative movement limit length from a first moving distance of said first component to obtain a difference, and for memorizing the difference as a second moving distance of said second component;

means for moving said second component by said second moving distance to place said second component;

wire compacting means for calculating routing limit position data representative of a routing limit position determined by pulling said wire between said first and said second components around said second component in said diagonal movement target direction; and rerouting means for trimming and replacing said wire within a routing limit range determined by said routing limit position;

said components being moved as a chain reaction in said diagonal movement target direction, by substituting said movement-designated component and said initial moving distance for said first component and said first moving distance, respectively, at a first time, and replacing said second component and said second moving distance for a new first component and a new first distance, respectively at and after second times, to obtain a resultant layout which is displayed on a display unit.

2. A graphic layout modification system as claimed in claim 1, further comprising means for detecting a chain reaction route of movement of components from said movement-designated component to a position-fixed component, and means for displaying said chain reaction route in a highlightened mode.

3. A graphic layout modification system as claimed in claim 1, further comprising constraint graph canceling means for preparing terminal graphs each of which records a pair of components connected in a longitudinal or a lateral direction and a wire therebetween, reading particular terminal graphs connecting said second component in a perpendicular direction perpendicular to the moving direction of other components, calculating a relative movement limit length of said second component in said perpendicular direction, and moving said second component by said relative movement limit length in said perpendicular direction.

4. A graphic layout modification system as claimed in claim 1, wherein said display unit displays only terminals and via holes of terminal constraint graphs without displaying wires during repetition of the component movement, said wire compacting means and said rerouting means thereafter determining wire positions;

said display unit displaying a resultant layout after the movement, including wire configurations.

5. A graphic layout modification system as claimed in claim 1, further comprising means for detecting a chain reaction route from said movement-designated component to a position-fixed component, and means for changing the moving distances of components on said chain reaction route into a limit distance which does not require the movement of said position-fixed component.

6. A graphic layout modification system as claimed in claim 5, further comprising component movement designating means for collectively designating movement target vectors including moving directions and moving distances for a plurality of components, and means for successively moving said plurality of components designated to move.

7. A graphic layout modification system as claimed in claim 6, said component movement designating means designating in longitudinal and lateral directions movement target vectors for a segment of a new component newly inserted into the layout, and further comprising means for inserting said designated segment and successively moving interfering components.

8. A graphic layout modification method of modifying a layout pattern of at least one layer with a plurality of components placed in a two-dimensional space by moving and replacing said components in each layout pattern, said method comprising the steps of:

receiving layout data representative of the placement of said components, decomposing each component into segments per layer plane, and preparing segment data in which those segments belonging to a single common component are assigned. with a common moving group number;

designating the movement of at least one of said components as a movement-designated component by entering a diagonal movement target direction and an initial moving distance;

calculating, in order to move said components in said movement target direction, a moving group relative movement limit length within which a first component is movable towards a second component which is adjacent to said first component in the diagonal movement target direction with a wire interposed therebetween, subtracting said moving group relative movement limit length from a first moving distance of said first component to obtain a difference, and memorizing the difference as a second moving distance of said second component;

moving said component by said second moving distance to place said second component;

calculating routing limit position data representative of a routing limit position determined by pulling said wire between said first and said second components around said second component in said diagonal movement target direction; and trimming and replacing said wire within a routing limit range determined by said routing limit position;

said components being moved as a chain reaction in said diagonal movement target direction, by substituting said movement-designated component and said initial moving distance for said first component and said first moving distance, respectively, at a first time, and replacing said second component and said second moving distance for a new first component and a new first distance, respectively at and after second times, to obtain a resultant layout which is displayed on a display section.

9. A graphic layout modification method as claimed in claim 8, further comprising the steps of detecting a chain reaction route of movement of components from said movement-designated component to a position-fixed component, and displaying said component linkage in a highlightened mode.

10. A graphic layout modification method as claimed in claim 8, further comprising the steps of preparing terminal graphs each of which records a pair of components connected in a longitudinal or a lateral direction and a wire therebetween, reading particular terminal graphs connecting said second component in a perpendicular direction perpendicular to the moving direction of other components, calculating a relative movement limit length of said second component in said perpendicular direction, and moving said second component by said relative movement limit length in said perpendicular direction.

11. A graphic layout modification method as claimed in claim 8, comprising the steps of making said display section display only terminals and via holes of terminal constraint graphs without displaying wires during repetition of the component movement, thereafter making said wire compacting means and said rerouting means determine wire positions, and making said display section display a resultant layout after the movement, including wire configurations.

12. A graphic layout modification method as claimed in claim 8, further comprising the steps of detecting a chain reaction route from said movement-designated component to a position-fixed component, and changing the moving distances of the components on said chain reaction route into a limit distance which does not require the movement of said position-fixed component.

13. A graphic layout modification method as claimed in claim 12, further comprising the steps of collectively designating movement target vectors including moving directions and moving distances for a plurality of components, and successively moving said plurality of components.

14. A graphic layout modification method as claimed in claim 13, comprising the steps of designating in longitudinal and lateral directions movement target vectors for a segment of a new component newly inserted into the layout, inserting said designated segment, and successively moving interfering components.

15. An information recording medium for use in a graphic layout modification system for modifying a layout pattern of at least one layer with a plurality of components placed in a two-dimensional space by moving and replacing said components in each layout pattern, said medium recording:

layout data converting means supplied with layout data representative of the placement of said components for decomposing each component into segments per layer plane to prepare segment data in which those segments belonging to a single common component are assigned with a common moving group number;

movement designating means for designating the movement of at least one of said components as a movement-designated component by entering a diagonal movement target direction and an initial moving distance;

means for calculating, in order to move said components in said movement target direction, a moving group relative movement limit length within which a first component is movable towards a second component which is adjacent to said first component in the diagonal movement target direction with a wire interposed therebetween, for subtracting said moving group relative movement limit length from a first moving distance of said first component to obtain a difference, and for memorizing the difference as a second moving distance of said second component;

means for moving said components by said second moving distance to place said second component;

wire compacting means for calculating routing limit position data representative of a routing limit position determined by pulling said wire between said first and said second components around said second component in said diagonal movement target direction; and rerouting means for trimming and replacing said wire within said routing limit range determined by said routing limit position;

said components being moved as a chain reaction in said diagonal movement target direction, by substituting said movement-designated component and said initial moving distance for said first component and said first moving distance, respectively, at a first time, and replacing said second component and said second moving distance for a new first component and a new first distance, respectively at and after second times, to obtain a resultant layout which is displayed on a display section.

16. An information recording medium as claimed in claim 15, further recording means for detecting a chain reaction route of movement of components from said movement-designated component to a position-fixed component, and means for displaying said chain reaction route in a highlightened mode.

17. An information recording medium as claimed in claim 15, further recording constraint graph canceling means for preparing terminal graphs each of which records a pair of components connected in a longitudinal or a lateral direction and a wire therebetween, reading particular terminal graphs connecting said second component in a perpendicular direction perpendicular to the moving direction of other components, calculating a relative movement limit length of said second component in said perpendicular direction, and moving said second component by said relative movement limit length in said perpendicular direction.

18. An information recording medium as claimed in 15, further recording means of making said display section display only terminals and via holes of terminal constraint graphs without displaying wires during repetition of the component movement, thereafter making said wire compacting means and said rerouting means determine wire positions, and making said display section display a resultant layout after the movement, including wire configurations.

19. An information recording medium as claimed in claim 15, further recording means for detecting a chain reaction route from said movement-designated component to a position-fixed component, and means for changing the moving distance of components on said chain reaction route into a limit distance which does not require the movement of said position-fixed component.

20. An information recording medium as claimed in claim 19, further recording component movement designating means for collectively designating movement target vectors including moving directions and moving distances for a plurality of components, and means for successively moving said plurality of components designated to move.

21. An information recording medium as claimed in claim 20, said component movement designating means designating in longitudinal and lateral directions movement target vectors for a segment of a new component newly inserted into the layout, and further recording means for inserting said designated segment and successively moving interfering components.

22. A graphic layout modification system for modifying a layout pattern with a plurality of components, said system comprising:

movement designating means for designating the movement of one of said components as a first component by entering a diagonal movement target direction and an initial moving distance;

means for calculating a moving group relative movement limit length within which said first component is movable towards a second component adjacent to said first component in the diagonal movement target direction with a wire interposed therebetween, for subtracting said moving group relative movement limit length from the initial moving distance of said first component to obtain a difference, and for memorizing the difference as a second moving distance of said second component;

means for moving said second component by said second moving distance;

wire compacting means for calculating a routing limit position determined by pulling said wire between said first and said second components around said second component in said diagonal movement target direction; and rerouting means for trimming and rerouting said wire within a routing limit range determined by said routing limit position.

* * * * *